US012724078B2

(12) United States Patent
Campbell et al.

(10) Patent No.: US 12,724,078 B2
(45) Date of Patent: Sep. 1, 2026

(54) INTELLIGENT BATTERY MANAGEMENT SYSTEM AND METHOD

(71) Applicant: BREATHE BATTERY TECHNOLOGIES LIMITED, London (GB)

(72) Inventors: Ian Campbell, London (GB); Yan Zhao, London (GB)

(73) Assignee: BREATHE BATTERY TECHNOLOGIES LIMITED, London (GB)

( * ) Notice: Subject to any disclaimer, the term of this patent is extended or adjusted under 35 U.S.C. 154(b) by 854 days.

(21) Appl. No.: 18/040,766

(22) PCT Filed: Aug. 6, 2021

(86) PCT No.: PCT/GB2021/052048

§ 371 (c)(1),
(2) Date: Feb. 6, 2023

(87) PCT Pub. No.: WO2022/029451

PCT Pub. Date: Feb. 10, 2022

(65) Prior Publication Data

US 2023/0305070 A1 Sep. 28, 2023

(30) Foreign Application Priority Data

Aug. 7, 2020 (GB) ..................................... 2012311

(51) Int. Cl.
*G01R 31/3835* (2019.01)
*G01R 31/392* (2019.01)
(Continued)

(52) U.S. Cl.
CPC ....... *G01R 31/3835* (2019.01); *G01R 31/392* (2019.01); *H01M 10/44* (2013.01); *H02J 7/64* (2026.01)

(58) Field of Classification Search
USPC .......................................................... 320/132
See application file for complete search history.

(56) References Cited

U.S. PATENT DOCUMENTS 6,515,453 B2 2/2003 Feil et al.
2014/0340045 A1 11/2014 Itabashi et al.
(Continued)

FOREIGN PATENT DOCUMENTS

GB 2597798 A 2/2022
JP 2017163687 A 9/2017
(Continued)

OTHER PUBLICATIONS

PCT International Search Report and Written Opinion dated Nov. 8, 2021 for International Application No. PCT/GB2021/052048, from which the instant application is based, 13 pages.

*Primary Examiner* — Samuel Berhanu
(74) *Attorney, Agent, or Firm* — Fredrikson & Byron, P.A.

(57) ABSTRACT

An intelligent battery management system and method, and in particular a method for the estimation of electrode potentials. The intelligent battery management system and method may be used in a battery control system, such as a battery charging/discharging system to preserve the health of a connected battery over multiple cycles, or in a battery diagnostic system for predicting or modelling battery performance. The battery management method uses an estimation of battery and electrode open-circuit potentials for a reference battery, combined with the battery overpotential fractions attributable to the negative and/or positive electrodes of the reference battery, to estimate the instantaneous electrode potentials for the connected battery. Using the battery overpotential in the determination of electrode potential, allows the battery management method and sys- (Continued)

tem to exhibit a high level of adaptivity to battery ageing and battery degradation.

19 Claims, 10 Drawing Sheets

(51) Int. Cl.
*H01M 10/44* (2006.01)
*H02J 7/64* (2026.01)

(56) References Cited

U.S. PATENT DOCUMENTS

2016/0006275 A1* 1/2016 Lee ........................ B60L 58/12
320/112
2018/0145528 A1 5/2018 Oh et al.
2020/0150183 A1* 5/2020 Yoon .................... G01R 31/374
2020/0292622 A1 9/2020 Wu et al.
2021/0013731 A1 1/2021 Choe et al.

FOREIGN PATENT DOCUMENTS

WO 2016151336 A1 9/2016
WO 2022029451 A1 2/2022

* cited by examiner

State-of-charge (%)

INTELLIGENT BATTERY MANAGEMENT SYSTEM AND METHOD

RELATED APPLICATIONS

This application is a 35 U.S.C. 371 national stage filing from International Application No. PCT/GB2021/052048, filed Aug. 6, 2021, which claims priority to British (GB) Application No. 2012311.3, filed Aug. 7, 2020, the teachings of which are incorporated herein by reference.

FIELD OF THE INVENTION

The present invention relates to an intelligent battery management system and method, and in particular to a battery management system utilising a method for the estimation of electrode potentials. The intelligent battery management system and method may be used in a battery control system, such as a battery charging/discharging system to preserve the health of the battery over multiple cycles, or in a battery diagnostic system for predicting or modelling battery performance.

BACKGROUND OF THE INVENTION

Society is observing a shift away from combustion as a source of energy. Solar panels connected to batteries can now power and heat our homes, while batteries in vehicles now provide either the main or auxiliary means of propulsion. Although still at an early stage, batteries are predicted to play an ever more vital role in decarbonising the aviation industry. Similarly, with renewables taking up an ever increasing share of national electricity generation, electricity distribution grids need to provide higher levels of battery storage capacity to stabilise supply when the sun is not shining or the wind is not blowing. At the same time, batteries continue to power our home electronics and electrical appliances. As battery applications proliferate, it is increasingly important that the energy and resource cost of batteries be minimised, and that individual battery health and lifetime be maintained. Degradation in a battery's health can lead to a reduction in both performance and safety.

Degradation of battery health occurs over time and with battery usage, often leading to reduced capacity, increased resistance, and/or other effects. The rate and extent of degradation is dependent upon multiple factors, with one specific factor being the potential of the electrodes within the battery. For example, a widely known degradation process results from low levels of electrode potential in lithium-ion intercalation batteries with graphitic negative electrodes, leading to the undesirable deposition of metallic lithium ("lithium deposition") on the graphite electrode. Another example is the possible oxidation of metallic current collectors at low potentials, which may lead to gassing and thus pose a safety risk.

To avoid the above-mentioned degradation and safety concerns, and in an effort to maintain battery state-of-health and safety as high as possible for as long as possible, it is typical when operating batteries to carefully control the cell terminal potential. The cell terminal potential is the difference in potential between a cell's positive and negative electrodes, and hereafter will simply be referred to as "cell potential" or "battery potential". Further, as will be described later, such potentials are typically expressed with respect to a predefined reference potential, such as the potential of lithium metal.

Although it would be preferable to know the values of the negative and positive electrode potentials, only the cell potential of the battery is usually used in battery control applications. This is because the cell potential indirectly controls the potentials of the positive and negative electrodes, and because unlike the negative electrode and positive electrode potentials, the cell potential can be easily measured. Direct measurement of the individual negative or positive electrodes potentials, for example, would require the battery to be provided with a separate reference electrode, which is presently only feasible on test rigs. Commercially available batteries do not provide a reference electrode for the measurement to take place.

Although computational methods may be used to estimate the negative and positive electrode potentials, such methods are often both complicated and resource intensive, and for reasons discussed below, predict the potentials with only a limited amount of certainty.

Conventionally, there are two approaches to obtaining the electrode potentials in full-cells: first, experimentally, using a reference electrode inserted into a full-cell (this is common in research communities but highly uncommon in commercially available cells because of associated difficulties with maintaining cell stability and increased cost); and, second, via state estimation using modelling and simulation, wherein mathematical models are used to estimate the electrode potentials.

However, there is considerable difficulty in predicting the values of the positive and negative electrode potentials with the required degree of confidence, such that the values may be used for battery control purposes and/or as information that is useful in understanding the battery's state-of-health. First, the open-circuit potentials of the electrodes and of the cell (the open-circuit potential is the equilibrium potential of either a battery or a material such as the positive or negative electrode) varies with other parameters such as state-of-charge, temperature, and the degradation or health of the battery. Secondly, both the cell and electrode potentials deviate from their open-circuit potentials under the application of a load (e.g. during battery charging or discharging), or following the removal of a load during a relaxation process where the potential converges towards the open-circuit value but requires time to reach it. As a result, predicting the negative or positive electrode potentials using state estimation methods carries a number of disadvantages, including one or more of computational cost, low stability and parameterisation difficulties.

High computational cost is due to a large amount of computer memory or processing power being required to perform the estimation. For example, electrochemical "full-order" continuum battery models have the capability to estimate electrode potentials, but rely on solving differential equations that describe temporal (and sometimes also spatial) variations in the concentration of electrochemical species (e.g. lithium) and the potentials of battery components (e.g. electrodes, electrolyte). An example of such a model for a rechargeable lithium-ion intercalation battery is the pseudo-two-dimensional model, relying on four partial differential equations for the description of lithium species concentrations and electric potentials, plus an analytical equation describing the relation between overpotential and lithium flux into or from the energy-storing electrode host materials. The high computational cost of solving such equations increases the associated monetary cost of the solution, as well as the size of the requisite hardware, thereby limiting the applicability of the state estimation approach and ruling out the option of implementing it on an embedded system such as a low-cost microcontroller target. Further, resulting models can often be insufficiently fast for real-time use.

Low stability is a further consideration as the numerical solutions sought by computational methods operating on the differential equations are not always stable. Convergence failures can occur in which no solution is found, or if the method converges to a solution value far away from reality. Unreliable methods could not be used in embedded applications where real-time and safety-critical control decisions may be being made based upon the estimated states.

Parameterisation difficulties include parameterisation cost and parameterisation complexity. Commonly, those battery models which are sufficiently complex to include electrode potentials as states also require data for a large number of battery parameters to be obtained for their use. Examples of such parameters in a full-order electrochemical model include electrolyte and electrode phase species (lithium) diffusivities, averaged electrode particle radii, electrode porosities and non-constant parameters such as the electrolyte conductivity as a function of salt concentration. This increases the time and cost of preparing the model for use with any given battery, because a large number of experimental studies are needed to obtain the battery parameters. Furthermore, it increases the difficulty of maintaining an accurate model as the battery degrades throughout its lifetime, because parameter values will need to be updated with a battery's evolving state-of-health. An example, is electrode porosity which is known to decrease with the build-up of products from parasitic side reactions. It is not currently possible to update many such parameters without cell disassembly, which of course is not conducive to continued use of the battery.

Remedies to all of these issues can be sought with reduced-order modelling involving simplified versions of full-order electrochemical models. However, even for reduced order modelling, the computational resources required still often exceed those available in embedded commercial hardware solutions, and the high parameterisation burden remains. Moreover, reduced-order approaches often introduce new shortcomings, such as a reduction in the accuracy of the state estimates at higher currents relative to those provided by full-order models.

We have appreciated that the widespread practice of using cell potential alone is unsatisfactory, because without direct control or even knowledge of the individual electrode potentials, one or both of the positive or negative electrode potentials may reach values that are detrimental to the battery state-of-health and/or to safety.

Further, we have appreciated that it would be desirable to provide an intelligent battery control method involving a real-time or predictive estimation of the individual negative and positive electrode potentials. The resulting estimates of electrode potential can advantageously be used to make battery control decisions, such as battery charging/discharging current, duration of charging/discharging processes, and/or other controllable parameters in the operation of a battery management system to maintain the health of the battery.

Further, the resulting estimates of electrode potential may be used in a diagnostic system to assess the present state-of-health of the battery, to determine the likelihood of future battery degradation, to support further battery development, to provide clarity and accountability for the battery warrantability, and to fulfil many other goals.

SUMMARY OF THE INVENTION

The invention is defined in the independent claims to which reference is now made. Advantageous features are set forth in the dependent claims.

In a first aspect of the invention, a computer-implemented battery management method for charging or discharging a connected battery, using non-equilibrium potentials for one or more of the negative and positive electrodes determined for the battery, and/or for use in a battery diagnostic method is provided. The battery management method comprises the steps of: determining for a connected battery one or more battery state parameters indicating the present state of the connected battery, the battery state parameters including at least the instantaneous cell potential and the state-of-charge of the connected battery; estimating for the connected battery, based upon the determined state-of-charge, one or more of: the battery open-circuit potential, and the open-circuit electrode potentials for the negative and/or positive electrodes; determining the overpotentials for the one or more of the positive and negative electrodes of the connected battery, based on the estimated open-circuit potential for the reference battery, by referring to a reference overpotential fraction representation that is available in memory and which maps the respective state-of-charge values for the reference battery to the corresponding fractions of the battery overpotential that are attributable to the negative and the positive electrodes; determining the non-equilibrium electrode potentials for the one or more of the negative and positive electrodes of the connected battery, based on the estimated open-circuit potential of the negative and/or positive electrodes of the reference battery, and the overpotentials for the respective negative and positive electrode; controlling the charging or discharging of the battery, or determining one or more parameters indicative of battery health depending on the determined non-equilibrium potentials for the one or more of the negative and positive electrodes.

The battery management method uses an estimation of battery and electrode open-circuit potentials for the connected battery, combined with the battery overpotential fractions attributable to the negative and/or positive electrodes of the reference battery, to estimate the instantaneous electrode potentials for the connected battery. Using the battery overpotential in the determination of electrode potential allows the battery management method and system to exhibit a high level of adaptivity to battery ageing and battery degradation.

A corresponding system and computer program are also provided.

BRIEF DESCRIPTION OF THE DRAWINGS

Embodiments of the invention will be described by way of example and with reference to the drawings in which.

DETAILED DESCRIPTION OF EXAMPLE EMBODIMENTS

An intelligent battery management system and method will now be described in more detail with reference to the Figures.

Examples are provided illustrating use of the battery management system for control of the charging current, and/or charging/discharging duration. Current control directly affects a battery's state-of-health, as the manner in which current is provided to or withdrawn from a battery affects the capability of the battery to continue to meet the demands made of it. The difficulty with prior art systems is that it is often not apparent what maximum current level can be supplied to or withdrawn from a battery while avoiding degradation of the battery's state-of-health.

The battery management system discussed below addresses this by estimating one or both of the electrode potentials of the battery connected to the management system. These electrode potentials can then be used as process values in a control system alongside set-points whose values are chosen to lower the degradation experienced by the battery.

Figure 1:
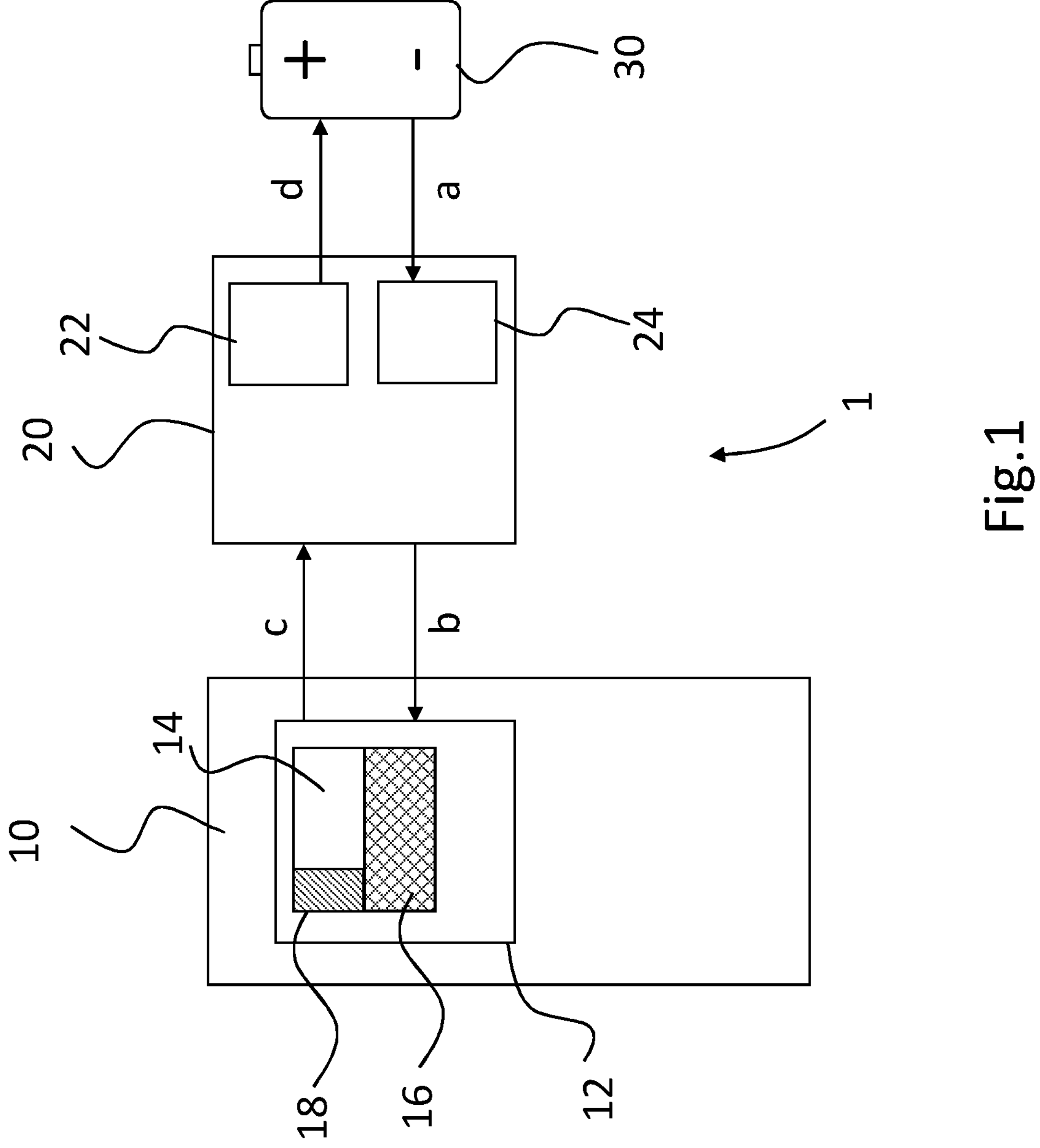
FIG. 1 illustrates a battery management system utilising a prediction of the non-equilibrium negative and/or positive electrode potential, according to a first example embodiment.

FIG. 1 illustrates an example battery management system 1 according to an example embodiment of the invention. The battery management system 1 comprises a battery management controller 10, and a battery charger/diagnostic unit 20 for connection to a battery 30. The battery charger/diagnostic unit 20 comprises charging/discharging terminals 22 for delivering a current to the battery 30, as well as one or more sensors 24 for determining one or more operational parameters indicating the state of the battery 30. These parameters may include cell potential, current measurement and/or temperature for example. In the examples that follow, the battery 30 is assumed to be a lithium ion battery, but could also be any electrochemical system, including for example a lithium metal battery, sodium ion battery, solid state battery or any variation thereof.

The battery management controller 10 and the battery charger/diagnostic unit 20 may be provided separately or may be provided as a single integrated unit. Where they are provided separately, the battery management controller 10 and the battery charger/diagnostic unit 20 include appropriate input/output or transmitter/receiver terminals for wireless or wired communication. Where provided as a single integrated unit, the battery management controller 10 may be hardware installed into the battery charger/diagnostic unit 20, or may be software configured to run on a processor/controller within the battery charger/diagnostic unit 20. Although the battery charger/diagnostic unit is shown as a single combined unit, these may be provided as separate units. Further, FIG. 1 is intended to include configurations where only one of a battery diagnostic function or a battery charging/discharging function is provided.

The battery management controller 10 may be embodied in hardware or software and/or as a combination of both. Examples include software installed on an integrated circuit or dedicated chip, provided in hardware form and with or without supporting circuitry such as a printed circuit board. The battery management controller 10 may also be provided in software form as one or more control algorithms for separate delivery or download into another dedicated system. The control algorithms may be embodied by any suitable form of software controller such as a bang-bang (on/off) controller, a proportional-integral-derivative controller, or any variation thereof containing some combination of proportional/integral/derivative elements, and a model predictive controller.

In FIG. 1, the battery management controller 10 illustrated comprises a processor and connected memory 12 on which one or more control programs, software instances or algorithms are stored for execution. The control software may comprise one or more dedicated modules or layers, including an application layer 14 in which battery control algorithms reside, safety layer software 16 which ensures the safe operation of the battery, and proprietary software module 18 for predicting the battery electrode potentials of the connected battery 30 according to the technique described below. The software modules and layers 14, 16 and 18 are illustrated in FIG. 1 purely by way of example to better understand the operation of the invention, and it will be understood that other logical arrangements and implementations of the software are possible.

In an example operation of FIG. 1, cell potential, temperature and current measurements are obtained from the battery 30 by one or more sensors 24 (information flow a), and are transmitted (information flow b) to the battery management controller 10.

These measurements are then used by the software module 18 to estimate the real time or instantaneous non-equilibrium negative and/or positive electrode potential of the battery 30, for use as the process values in a battery charging current control process implemented by modules 14 and 16. The operation of software module 18 will be described in more detail with reference to FIGS. 3 to 10. Accordingly, the software modules 14 and 16 of battery management controller 10 determine a charging set point or target and provide this (information flow c) to the battery charger/diagnostic unit 20. The battery charger/diagnostic unit 20 subsequently provides (information flow d) a charging current to connected battery 30.

The charging current is controlled in real time based on the measured parameters of the battery, in order to minimise long-term battery degradation (by avoiding lithium deposition for example in the case of a lithium ion intercalation battery, or by appropriately managing lithium deposition for example in the case of a lithium metal battery), while preferably providing a high charging current to minimise charging time. In other embodiments, and where appropriate, short charging times may be avoided to maintain battery health. As noted above a battery's state-of-health may be understood in terms of changes in the battery's resistance, and capacity and other factors.

In FIG. 1, software and hardware modules are discussed and illustrated. In embodiments, it will be appreciated that the software modules discussed herein may be embodied as a machine-readable medium, a computer-readable medium, or as a computer readable storage medium, and that such media may refer to any medium providing data, computer or machine instructions that cause a machine to operate in the manner described. Such media may be physical and tangible non-volatile, non-transitory storage media like floppy disks, flexible disks, hard disk, magnetic tape, CD-ROMs optical or magnetic disks, solid state storage devices, memory chips or cartridges, embodying RAM, PROM, EPROM FLASH-EPROM. This list is purely for illustration and is not intended to be exhaustive.

Figure 2:
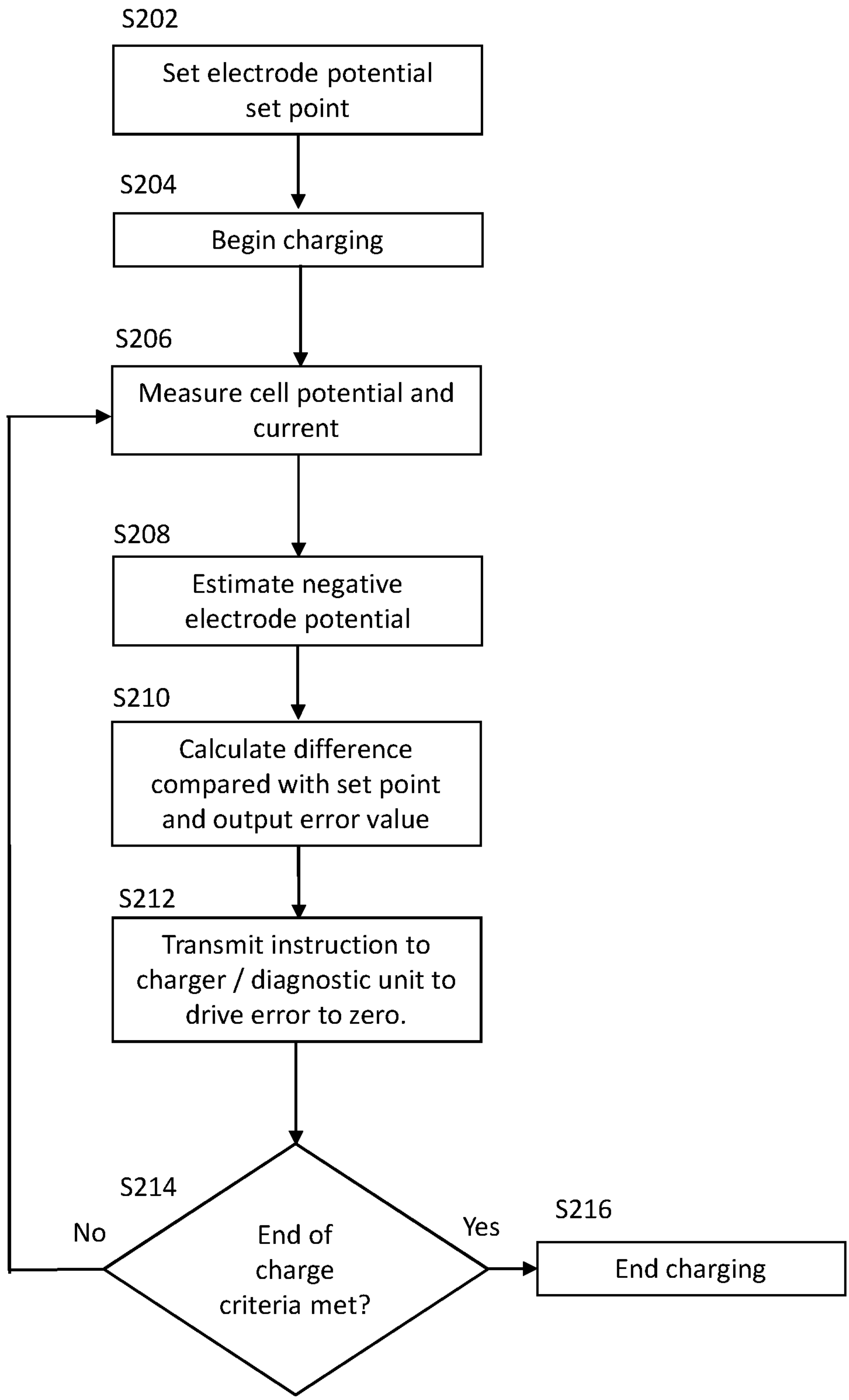
FIG. 2 illustrates a method for the determination of battery charging current using an estimate of non-equilibrium negative and/or positive electrode potential according to an embodiment of the invention.

FIG. 2 illustrates an example battery charging application using the battery management system 1 of FIG. 1. The battery charging method begins in step S202 with the determination of a control set point by the battery management controller 10. The control set point is based on a physically meaningful value of electrical potential selected for the battery 30, such that by maintaining the process value at that set point value, or at a fixed distance from it, battery degradation processes are minimised.

As will be discussed later, the control set points are one or more of the non-equilibrium potentials on the negative and positive electrodes $V_{neg}$ and $V_{pos}$ of the battery under consideration, that is the battery connected to the battery management system. This means that charging/discharging can be carried out safely, because the charger/diagnostic unit 20 is able to apply a charging/discharging current to the battery terminals based on an accurate estimate of one or both of the electrode potentials where the current is applied, rather than a general measurement of the cell potential, from which the electrode potentials cannot be understood.

To determine $V_{neg}$ and $V_{pos}$, the battery management method and system takes advantage of the fact that it is relatively easy to obtain the cell overpotential $\eta_{cell}$, because values for the cell potential $V_{cell}$ and cell open-circuit potential $U_{cell}$ are easy to obtain. From an understanding of how the cell overpotential $\eta_{cell}$ is made up of the overpotentials at the respective electrodes $\eta_{pos}$ and $\eta_{neg}$, the subtraction is simple with respect to the cell open-circuit potential data ($U_{cell}$) available in memory, and from the cell overpotential $\eta_{cell}$ the values of $V_{neg}$ and $V_{pos}$ can be calculated.

Using the cell overpotential $\eta_{cell}$ in this way to determine the electrode potentials means that the battery management system and method exhibits a good degree of automatic adaptivity to battery ageing and battery degradation. This is because the cell overpotential $\eta_{cell}$ tends to increase with battery age for a variety of reasons including for example the growth of interphase layers such as the solid-electrolyte interphase, meaning the calculated overpotential at the electrode $\eta_{pos}$ and $\eta_{neg}$ is increased accordingly.

The result is that control decisions, such as the control of the magnitude and/or duration of current to/from the battery may automatically become more conservative as the battery degrades. This has the positive effect of prolonging battery lifetime and maintaining on average a higher degree of battery health for longer.

In FIG. 1, and assuming that the battery 30 is a lithium ion battery, a negative electrode potential set point of 0.1 Volts with respect to the reference potential of metallic lithium may be chosen. This value is based on a physically meaningful value of 0.0 Volts, above which degradation by lithium deposition is minimised, summed with a safety margin of 0.1 Volts. Where battery 30 employs a different battery technology to lithium ion, a different control set point may be appropriate. In this example embodiment, the negative electrode potential set point is determined by application and safety layer software modules 14 and 16 of the battery management controller 10 for example, based on a battery technology type input by the user, or determined by the battery management system 1 based on initial measurements when battery 30 is connected.

In step S204, and based on the determined set point, the battery management controller 10 instructs the battery charger/diagnostic unit 20 to begin applying an initial charge to the battery. The initial charge can be a pre-set level considered to be safe, such as 1 C for example. Alternatively, the initial charge can be a pre-calculated level that has been estimated to produce a desirable initial relationship between the instantaneous value of negative or positive electrode potential (estimated as a process value in the charging process and based on an initial measurement of cell potential, current and/or temperature in set) and the target or set point for the negative or positive electrode potential.

The selection of the initial set point in step S202 and the determination of the initial charge in step S204 will not be described in detail in this application, which is concerned with the estimate of the individual electrode potentials and the use of this in a battery management method. A number of techniques for determining the set point and initial charging current are known to the skilled person, and need not be described further.

In step S206, the cell potential and the applied current at that moment are measured by the battery charger/diagnostic unit 20 and their values provided to the battery management controller 10. The cell temperature may additionally be measured and provided in this step, whether required for safety monitoring, or as an index to obtain temperature related parameters (e.g. variations in the overpotential fraction or open-circuit potential). These measured quantities may additionally benefit from some degree of estimation or filtering to enhance their usefulness and/or accuracy.

In step 208, the measured quantities are used as inputs by the battery management controller 10 to determine an estimate of the negative and/or positive electrode potential (the process value(s)) at the instant in time. The method for doing this is discussed below in more detail in connection with FIGS. 3 to 10.

In step S210, the battery management controller 10 calculates the difference between the process value(s) and the set point value(s) received in step S202, and based on the difference, determines an error value.

In subsequent step S212, the battery management controller 10 determines, based on the error value, an appropriate control instruction for the battery charger/diagnostic unit 20 charging process, for example how the charging current target should be adjusted, to drive the error value to zero in the next instant, and transmits this to the battery charger/diagnostic unit 20. This is a target which defines the maximum permissible charging current that should be provided for the battery 30 taking the present battery state into account. There may be reasons why the charger provides a current to the battery which is less than the target being broadcast from the invention, such as an over-riding safety function interfering.

In step S214, the battery management controller 10 determines whether the end-of-charge criteria are met in order that the charging process ends safely. Criteria for ending the charging process may be one or more of a cell potential target such as 4.2 Volts having been reached, a state-of-charge target having been reached, such as 100% state-of-charge, a temperature target having been reached, such as the battery reaching 50 degrees Celsius, and/or a charging time target having been reached, such as 30 minutes having elapsed. It will be appreciated that this is a non-exhaustive list, and that other criteria may apply.

If the end-of charge criteria are determined to have been met in step S214 (Yes), then the charging process ends in step S216. While ever the end-of-charging criteria are deemed not met, the charging process is ongoing, and the method returns to step S206 in which the battery management controller 10 measures cell potential and current, and in the closed-loop feedback process of steps S208 to S214, determines a process value indicating the potential of the negative electrode, compares the process value against the set point, determine whether and by how much the charging current target being transmitted from the battery management controller 10 to the battery charging/diagnostic unit 20 should be adjusted, and transmit this to the battery charger/diagnostic unit 20. Charging continues at this revised current level at the next instant and the process repeats until an end-of-charge state, all the while producing a dynamic current in response to an estimate of the negative or positive electrode potential vs. a set point. Consequently, when the charger/diagnostic unit 20 provides the target current to the battery, the input current profile will typically vary with time in a manner that has minimised (or best sought to minimise) the error.

As noted above, the charging method of FIG. 2 relies on estimating the negative electrode potential of the connected battery 30 and using this as a process value in the method to control the applied current. The method of estimating the negative electrode potential will now be described in more detail with reference to FIGS. 3 to 10.

Background and Discussion of Overpotentials

First, and with reference to FIGS. 3 to 5, the concepts of open-circuit potential, polarisation and overpotentials will be discussed.

Figure 3A:
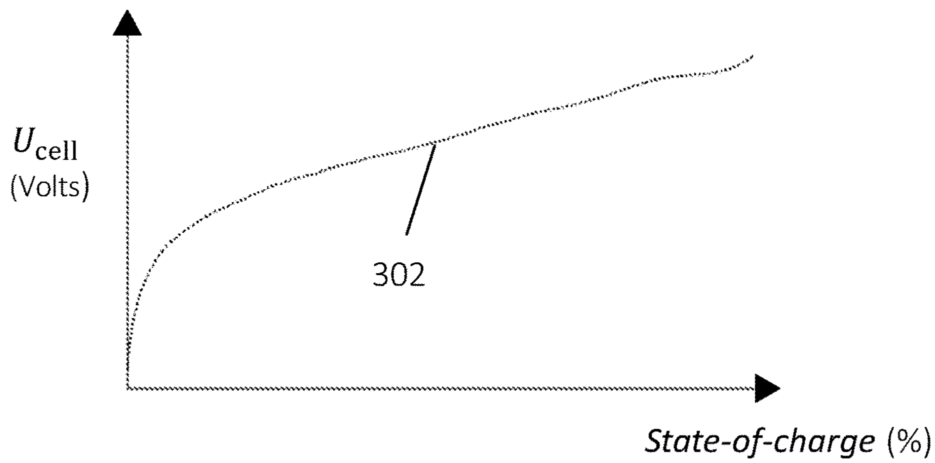
FIG. 3 illustrates a reference open-circuit potential representation for a reference battery, and includes FIG. 3A which is a plot of the measured open-circuit potential for the reference battery against a state-of-charge measurement for the reference battery, and FIGS. 3B and 3C which are the corresponding plots for the open-circuit potentials of the positive and negative electrodes of the reference battery.
Figure 3B:
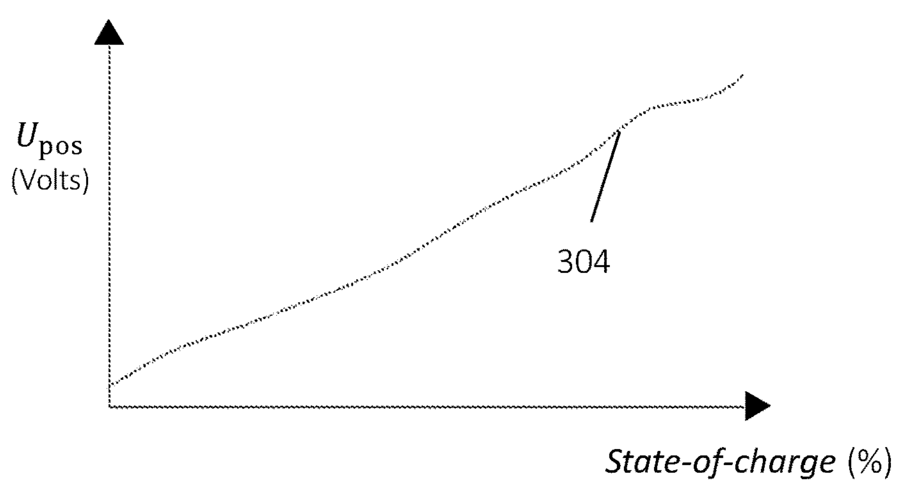
Figure 3C:
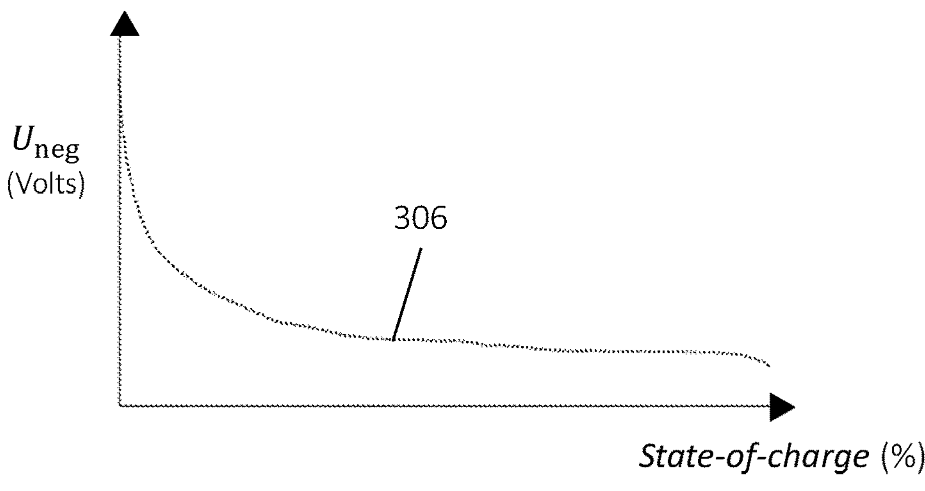

By way of introduction, FIG. 3 illustrates the open-circuit potentials for a cell as a function of the battery state-of-charge. The open-circuit potential is the electric potential under equilibrium, that is the electric potential when no current is passing through the battery, of either a battery or a material such as the positive or negative electrode. FIG. 3 illustrates the open-circuit potential (FIG. 3A), the positive electrode (FIG. 3B) and the negative electrode (FIG. 3C) against the state-of charge (%) of the battery. Each of the respective potentials, 302, 304 and 306 will be understood to be functions of both the state-of-charge, and of other factors such as the battery temperature and the battery's degradation state (i.e. the battery's health). For the purposes of illustration, the additional dependencies of the open-circuit potential on temperature and other factors, as well as additional properties such as hysteresis, are not illustrated but will be understood to apply.

The relationship between cell open-circuit potential $U_{cell}$ and the open-circuit potentials of the positive $U_{pos}$ and negative $U_{neg}$ electrodes is given by Equation 1 as:

$$U_{cell}=U_{pos}-U_{neg} \quad \text{Equation 1:}$$

Referring to FIG. 3A, profile 302 illustrated in FIG. 3A is therefore the difference between profiles 304 and 306 in FIGS. 3B and 3C.

When a charge or discharge current is applied to a cell polarisation occurs, leading to an offset of the potentials from their open-circuit potentials. Polarisation is the term given to the departure of a potential from the open-circuit potential, arising from one or more sources (ohmic "IR", activation and concentration). The resulting potentials may be considered to be non-equilibrium potentials represented by V. As before, the cell potential $V_{cell}$ is the difference between the electrode potentials $V_{pos}$ and $V_{neg}$:

$$V_{cell}=V_{pos}-V_{neg} \quad \text{Equation 2:}$$

FIG. 4 shows how, when the battery is in a non-equilibrium condition, polarisation results in an offset of the potentials from their open-circuit values. Dotted lines 402, 404 and 406 in FIG. 4 illustrate the open-circuit potentials $U_{cell}$, $U_{pos}$ and $U_{neg}$ illustrated in FIG. 3, while the bold lines 408, 412 and 416, and the dashed lines 410, 414, and 418 indicate the non-equilibrium potentials $V_{cell}$, $V_{pos}$ and $V_{neg}$ at a low charging current and a high charging current respectively (different C rates).

Figure 4A:
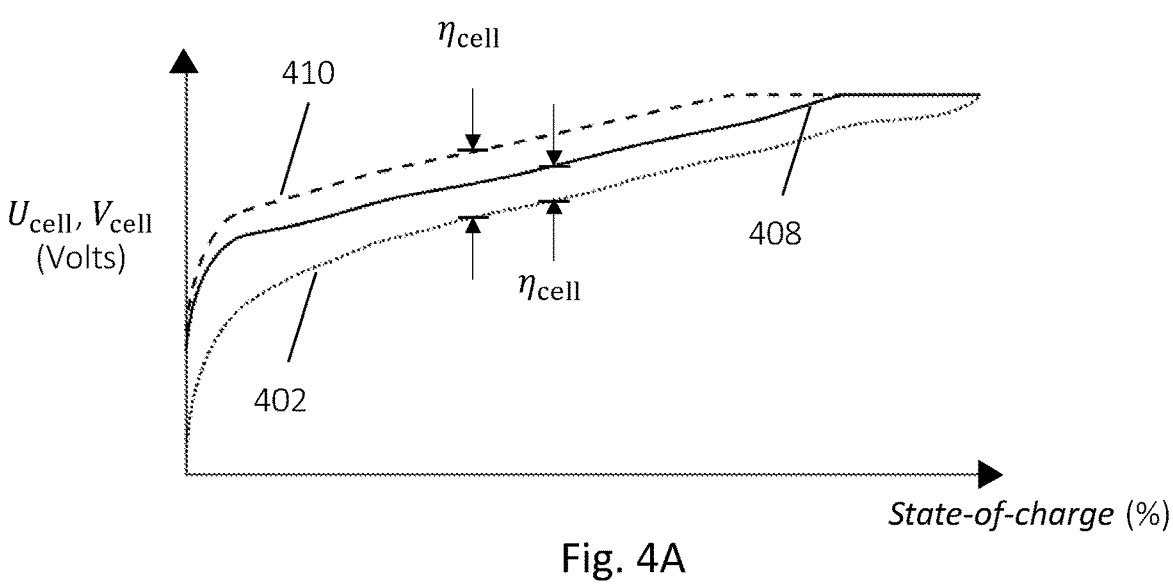
FIG. 4 illustrates variations in the battery and electrode potentials illustrated in FIG. 3 in a polarised or non-equilibrium state, and includes FIG. 4A which is a plot of the measured non-equilibrium battery potential for the reference battery against a state-of-charge measurement for the reference battery in a charging/discharging process (two different charging currents (C-rates) are illustrated), and FIGS. 4B and 4C which are the corresponding plots for the electrode potentials of the positive and negative electrodes of the reference battery.
Figure 4B:
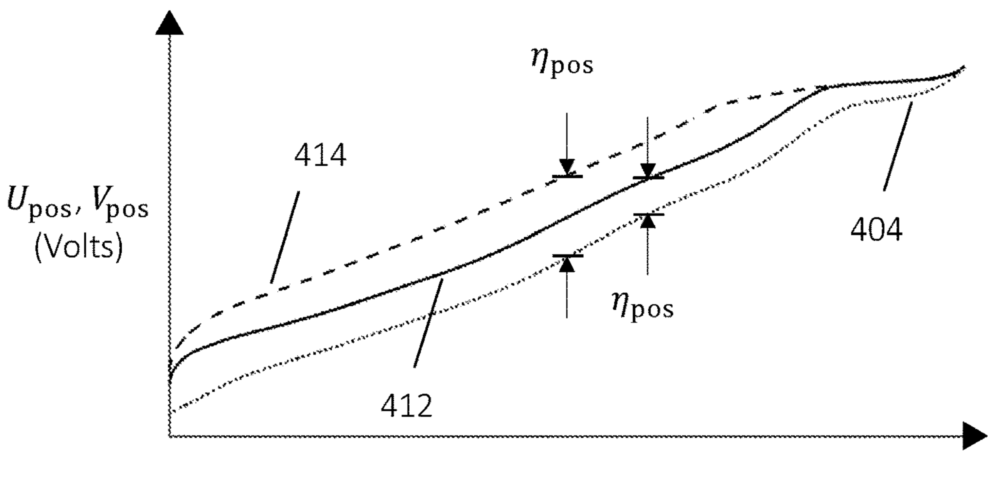
Figure 4B:
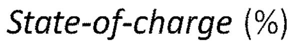
Figure 4C:
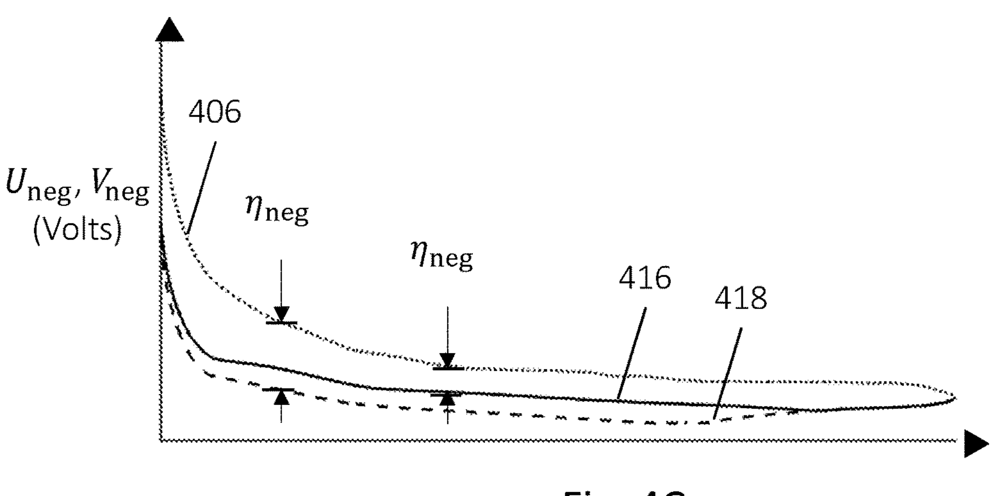

The magnitude of the polarisation is referred to as the overpotential $\eta_{cell}$, $\eta_{pos}$ and $\eta_{neg}$ and is illustrated in FIGS. 4A, 4B and 4C by the deviation away from the dotted line curve for both the bold and dashed line charging scenarios. Mathematically, the overpotential is defined as:

$$\eta_{cell}=V_{cell}-U_{cell} \quad \text{Equation 3:}$$

$$\eta_{pos}=V_{pos}-U_{pos} \quad \text{Equation 4:}$$

$$\eta_{neg}=V_{neg}-U_{neg} \quad \text{Equation 5:}$$

By definition, during cell charging, $\eta_{cell}$ and $\eta_{pos}$ are positive quantities while $\eta_{neg}$ is a negative quantity. Although FIG. 4 depicts behaviour arising from the application of a charging current to the battery, this could alternatively be illustrated under the application of a discharging current, in which case the potentials would instead, relative to the open-circuit potential, be lower for the cell, lower for the positive electrode, and greater for the negative electrode. The three quantities adopt the opposite signs during cell discharging.

Figure 5A:
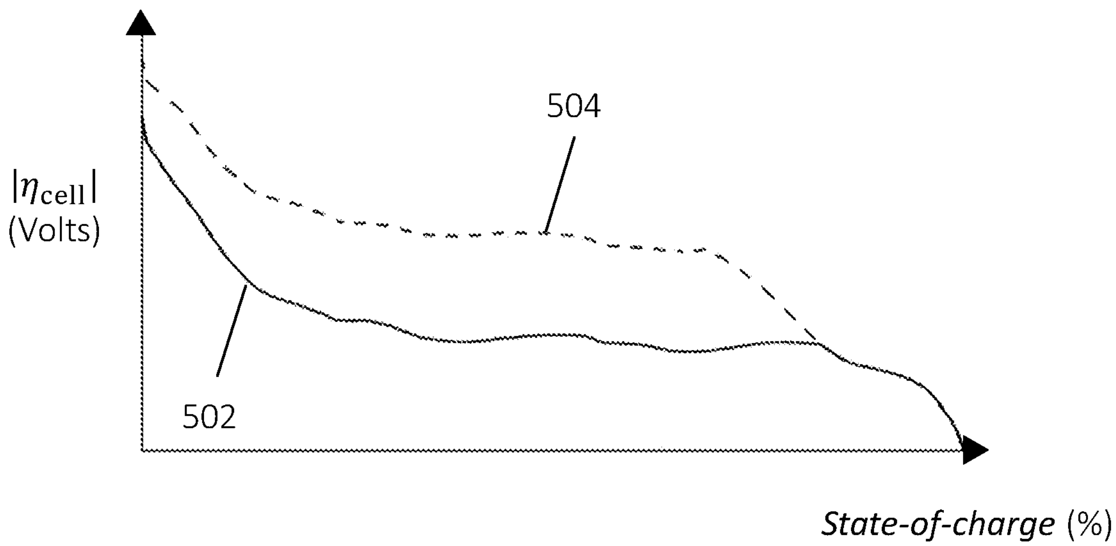
FIG. 5 illustrates the corresponding overpotential profiles, including FIG. 5A which is a plot of the corresponding overpotential profiles for the reference battery and for the two different charging currents (the overpotential profiles being equal to the difference between the open-circuit potentials and the non-equilibrium potentials for the plots of FIGS. 3 and 4), and FIGS. 5B and 5C which are the corresponding plots for the overpotential profiles of the positive and negative electrodes of the reference battery.
Figure 5B:
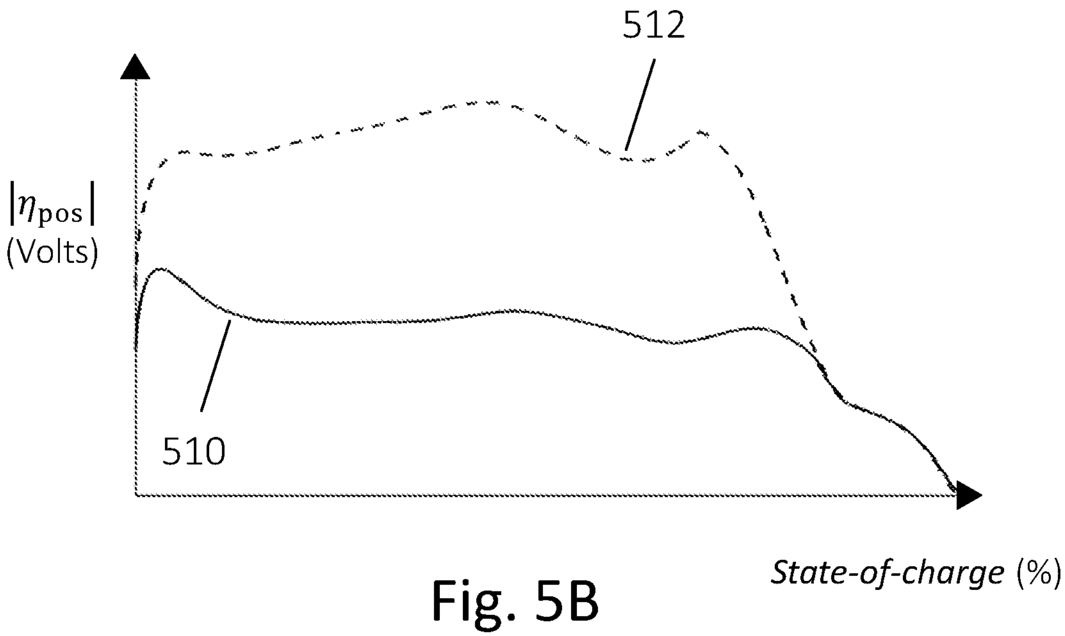
Figure 5C:
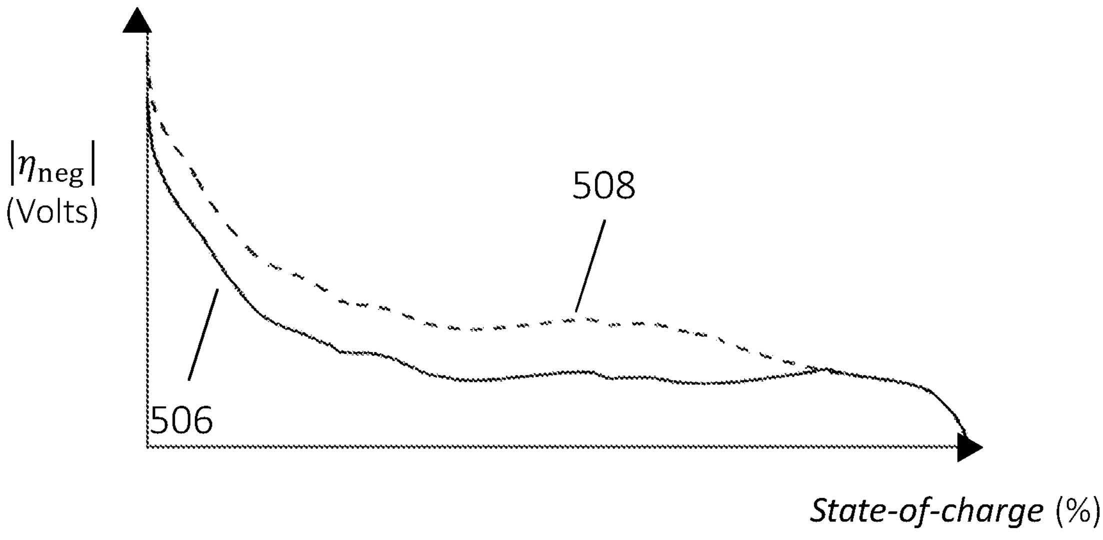

FIGS. 5A, 5B and 5C shows for each of FIGS. 4A, 4B and 4C, the corresponding magnitude of the overpotentials expressed as a function of the state-of-charge. It will be appreciated that these are non-linear functions, varying in dependence on a number of parameters.

In FIG. 5B, curve 510 is the absolute positive electrode overpotential $\eta_{pos}$ with a relatively low applied charging current, while 512 is the absolute positive electrode overpotential $\eta_{pos}$ with a relatively high applied charging current. Similarly, in FIG. 5C, plot 508 is the absolute negative electrode overpotential $\eta_{neg}$ with a relatively low applied charging current, and 506 is the absolute negative electrode overpotential $\eta_{neg}$ with a relatively high applied charging current. As can be seen in these figures, the overpotentials are not linear, and they can vary significantly with the state-of-charge of the battery.

The profiles illustrated in FIGS. 3, 4 and 5 were generated using a commercially-available lithium-ion intercalation style rechargeable battery with a graphitic negative electrode and a composite nickel-cobalt metal oxide positive electrode, at a battery temperature of 25 degrees Celsius.

In this case, the $U_{cell}$ in profile 302 of FIG. 3A may adopt values ranging from 2.5 V at a 0% state-of-charge to 4.2 V at a 100% state-of-charge. $U_{pos}$ in profile 304 of FIG. 3B may adopt values ranging from 3.54 V at a 0% state-of-charge to 4.24 V at 100% state-of-charge. $U_{neg}$ in profile 306 of FIG. 3C may adopt values ranging from 1.04 V at 0% state-of-charge to 0.04 V at 100% state-of-charge.

In FIG. 4A, plot 402 illustrates the same cell open-circuit potential $U_{cell}$ shown previously as 302, having an example value of 3.73 V at 50% SOC, while plot 408 illustrates the cell potential $V_{cell}$ with a relatively low applied charging current of 1 C (4 amperes), having an example value of 3.90 V at 50% SOC, and plot 410 illustrates the cell potential $V_{cell}$ with a relatively high applied charging current of 2 C (8 amperes), having an example value of 4.04 V at 50% SOC.

Similarly, in FIG. 4B, curve 404 illustrates the same positive electrode open-circuit potential $U_{pos}$ shown previously as 304, having an example value of 3.86 V at 50% SOC. Curve 412 is the positive electrode potential $V_{pos}$ with a relatively low applied charging current of 1 C, having an example value of 3.94 V at 50% SOC, and 414 is the positive electrode potential $V_{pos}$ with a relatively high applied charging current of 2 C, having an example value of 4.02 V at 50% SOC.

Lastly, in FIG. 4C, curve 406 is the same negative electrode open-circuit potential $U_{neg}$ illustrated previously as 306, having an example value of 0.13 V at 50% SOC. Curve 416 is the negative electrode potential $V_{neg}$ with a relatively low applied charging current of 1 C, having an example value of 0.04 V at 50% SOC, while curve 418 is the negative electrode potential $V_{neg}$ with a relatively high applied charging current of 2 C, having an example value of −0.02 V at 50% SOC.

In FIGS. 5A, 5B and 5C prior to the absolute values being taken, typical values of $\eta_{cell}$, $\eta_{pos}$ and $\eta_{neg}$ at 50% state-of-charge would be 0.17 V, 0.08 V and −0.09 V, respectively, for the same relatively low applied charging current.

The Method

As noted above, the battery management system and method relies on the ability to attribute a fraction of the overall cell overpotential $\eta_{cell}$ (which can be easily measured for a commercial available cell using the apparatus of FIG. 1) to each of the positive and negative electrodes, thus obtaining an estimate of the overpotentials $\eta_{pos}$ and $\eta_{neg}$ at each of the respective electrodes. Mathematically, the overpotentials can be expressed as a function of the cell overpotential $\eta_{cell}$ as follows:

$$\eta_{pos}=\eta_{cell}\times\eta_{f,pos} \quad \text{Equation 6:}$$

$$\eta_{neg}=\eta_{cell}\times\eta_{t,neg} \quad \text{Equation 7:}$$

where $\eta_{f,pos}$ and $\eta_{f,neg}$ are the fractions of the total cell overpotential $\eta_{cell}$ attributed to the positive and negative electrode respectively. Since the fraction of cell overpotential which should be attributed to each electrode is non-constant and instead varies with state-of-charge, and with other factors including the applied current level, these fractional values are stored as look-up tables or as mathematical functions in computer memory for a reference battery. These are referred to as reference overpotential fraction representations (or overpotential fraction maps) and they enable the estimation of electrode potentials under a wide range of battery usage.

The operation parameters of a new battery connected to the battery management system 1, specifically the negative and/or positive electrode values of the connected battery, can then be deduced from simple measurements of quantities like the battery terminal potential and a measurement or estimation of the battery's state-of-charge, and comparison with the overpotential fraction maps stored in memory for the reference battery. This requires that the reference battery used to generate the map be a good approximation for any battery later connected to the battery management system. Necessarily, the battery management system may therefore store maps and/or tables for different types of battery technology, such that if a lithium ion battery is connected to the battery management system, an overpotential fraction map is available in memory to consult.

An apparatus and method for determining the overpotential fraction maps will now be described, in connection with FIGS. 6, 7 and 8.

Figure 6:
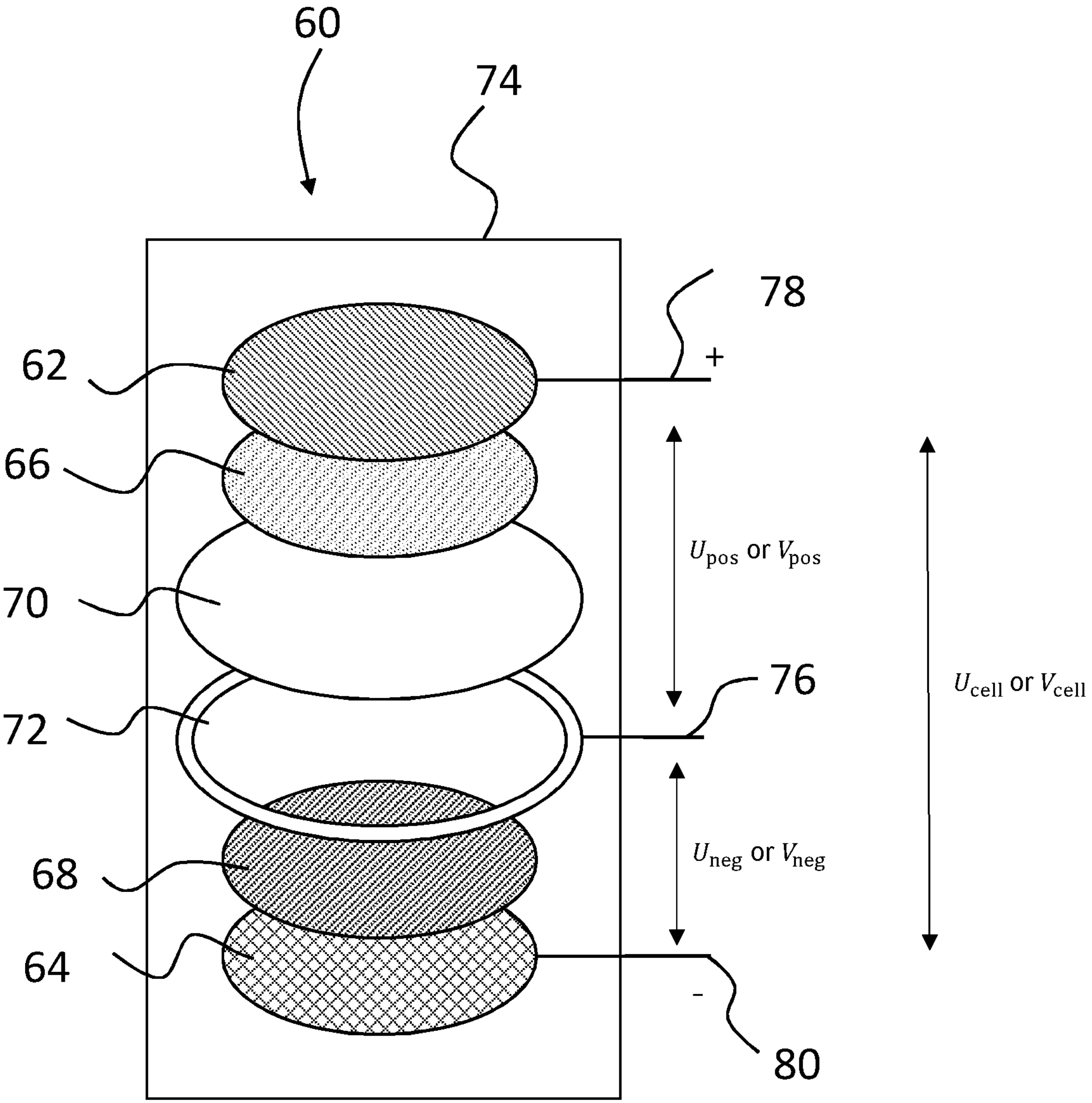
FIG. 6 is an illustration of a full-cell with reference electrode that may be used in an embodiment of the invention to obtain for the reference battery the open-circuit potentials in FIG. 3 and the non-equilibrium potentials in FIG. 4.

FIG. 6 is a diagram showing an experimental full-cell with reference electrode, which allows the open-circuit potential and overpotential data for the cell, and for the positive and negative electrodes to be determined for a test or reference battery, for any number of different charging scenarios and battery parameters. For each battery type or model to be used with the battery management controller 10 it will be necessary to analyse a characteristic test cell and obtain the data and save this in memory as one or more look-up tables or functions for the purposes of the calculation to be used by the battery management controller.

It is sufficient for satisfactory operation of the battery management controller, if the data sets are determined for each type of battery, assuming new battery materials in which no use dependent degradation has yet occurred, for at least one value of charging current. Preferably, data sets for respective battery types involving different charging currents, different battery temperatures, and/or different battery states of health may also be generated. If these additional data sets are not generated experimentally by direct measurement using the experimental system of FIG. 6, then they may be calculated with reasonable accuracy by interpolation or calculation based on the data determined for a new battery at a single temperature.

The data shown in FIG. 3 for example may be generated by measurement using the apparatus of FIG. 6 for a reference battery, and be available in memory as one or more open-circuit potential representations for use in the battery management method. Each of the respective potentials, 302, 304 and 306 will be understood to be functions of both the state-of-charge, and of other factors such as the battery temperature and the battery's degradation state (i.e. the battery's health). For the purposes of illustration here the additional dependencies of the open-circuit potential on temperature and other factors, as well as additional properties such as hysteresis, are not illustrated but will be understood to apply. In embodiments, the data in FIGS. 4 and 5 may also be generated and stored.

Referring now to FIG. 6, an experimental full-cell 60 with a reference electrode is illustrated. Preferably, this is constructed from new electrode materials which correspond to the battery technology of the commercial batteries that will be used with the battery management controller 10. In this application, lithium ion battery technology is assumed to be a preferred battery type, and FIG. 6 therefore illustrates an experimental measurement cell corresponding to a lithium ion battery technology.

The experimental full-cell 60 comprises positive electrode current collector 62, which may be an aluminium foil, a negative electrode current collector 64, which may be a copper foil, a sheet of positive electrode material 66, a sheet of the negative electrode material 68, and a separator 70 which may be fresh or harvested from the existing cell. This may for example be a polymeric or glass-fibre material with a thickness of approximately of 20 micrometres. The experimental full-cell 60 further comprises a reference electrode 72, which may be lithium metal, and which is not intended to actively participate in the electrochemical reactions of the full-cell. It is this reference electrode which enables the measurement of the individual (i.e. positive and negative) electrode potentials in an experimental setting, as illustrated in the figures above.

Components 66 to 70 are wetted with an electrolyte, which may be a salt such as lithium hexafluorophosphate (LiPF6) acting as a solute, dissolved in a solvent mixture such as a combination of ethylene carbonate, diethyl carbonate and dimethyl carbonate. The wetted stack of components is then installed in a hermetically sealed casing 74 providing electrical connections between battery measurement equipment, and a connection point 76 for the reference electrode 72, a connection point 78 for the positive electrode's current collector 62, and a connection point 80 for the negative electrode's current collector 64. These connections permit measurement of the full-cell potential, of positive electrode potential with respect to the lithium metal reference electrode 72, and finally of the negative electrode potential with respect to the lithium metal reference electrode.

Before the experimental full-cell 60 is used to generate the reference data for the battery management system 10, formation cycling is carried out, in which the reference cell is charged and discharged, to form (or re-form) protective layers on electrode surfaces. After formation cycling, the experimental cell can be used to obtain the three open-circuit potential datasets for the cell, and the respective positive and negative electrodes.

Figure 7:
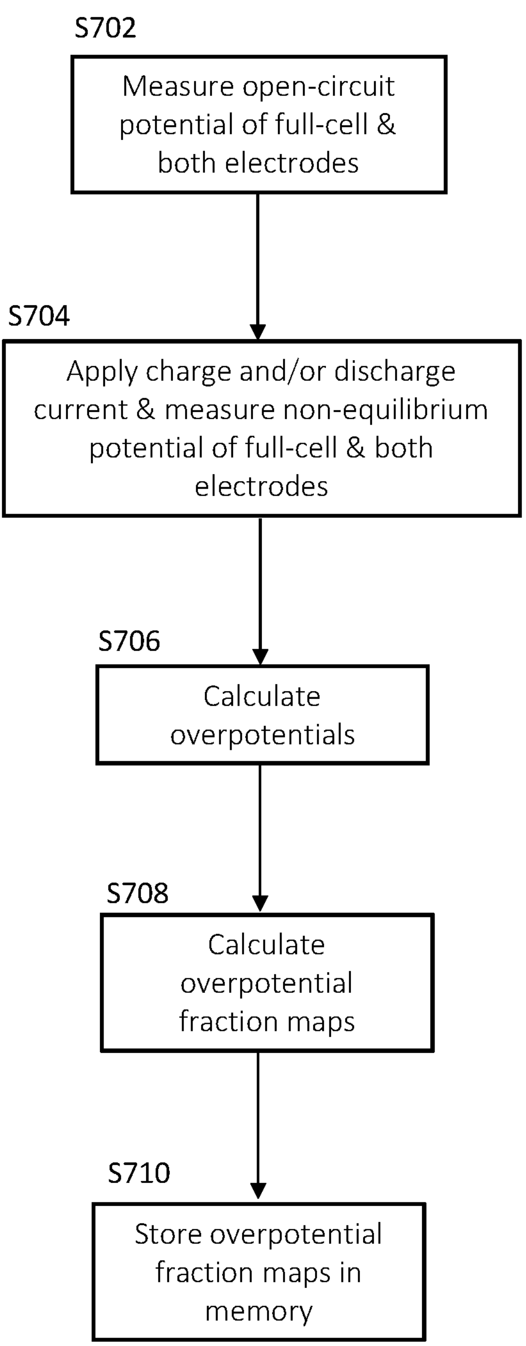
FIG. 7 illustrates a method for creating the reference overpotential fraction representation using the full-cell illustrated in FIG. 6.

With reference to FIG. 7, a method for generating the overpotential fraction maps will now be described. Although this method applies for the generation of the overpotential fraction maps for any battery technology, it will again be described in the context of a lithium ion battery, and the open-circuit and non-equilibrium potential plots illustrated in FIG. 4.

As noted above, it is sufficient if the charging profiles are generated for a single operational temperatures. To do so, the cell may be: a) charged or discharged extremely slowly (e.g. at a C-rate of C/50) so that overpotentials are minimised and the potentials recorded are good approximations of the open-circuit potentials; b) charged or discharged between various state-of-charge levels, with the current then being removed, and the cell potentials allowed to relax and converge to the open-circuit potential at that state-of-charge; c) other method of open-circuit potential determination using charging/discharging techniques which will be known to the skilled person.

In step S702, to produce the exemplary open-circuit data sets in FIG. 3 for $U_{cell}$, $U_{pos}$ and $U_{neg}$, the reference cell illustrated in FIG. 6 was operated using a constant-current C/50 (0.08 ampere) rate charging process and a constant-current C/50 rate discharging process. The low charging/discharging current is selected to approximate an equilibrium situation in which the measured cell potential closely approximates the open-circuit potential. The resulting open-circuit potentials at each state-of-charge value were recorded, and following the respective charging and discharging process, the resulting cell potential profiles for each of the respective potential curves ($U_{cell}$, $U_{pos}$ and $U_{neg}$) were averaged or interpolated to produce plots 302, 304, and 306. Step S702 is preferably carried-out with the reference cell in a controlled-temperature environment. As noted above, a typical temperature is 25 degrees Celsius, although other temperatures may be used, corresponding to battery temperatures that might be encountered in practice, such as negative 40 degrees Celsius to positive 50 degrees Celsius.

In step S704, the non-equilibrium potentials exemplified in FIG. 4 are produced, by operating the reference cell to charge and/or discharge at higher currents than in step S702, such that the cell potential and the positive and negative electrode potentials are driven away from their open-circuit values by more than is experienced with the low currents used in step S702 previously aimed at approximating equilibrium. For example, a charging current of 4 amperes may be applied in step S704, which is 50 times greater than the 0.08 ampere current used in the approximation of open-circuit potential in step S702.

Again, the reference cell is operated at a temperature of 25 degrees Celsius for consistency with step S702, over the same state-of-charge window. The cell potential and electrode potentials are measured under the application of these currents for a charging and/or discharging process and stored. They may then be smoothed, post-processed or interpolated to generate the bold and/or dashed line plots 408, 410, 412, 414, and 416, 418 of FIG. 4.

When choosing a current level to use in step S704 it is desirable to use a level that is close to the current level likely to be encountered in commercial applications for the battery. In this way, any dependency of the overpotential fraction map obtained on the charging/discharging current can be accounted for, and matched with the likely current encountered during use in order to improve accuracy.

In step S706, the overpotential profile over the same state-of-charge window is now calculated, based on the open-circuit potentials and the non-equilibrium potentials obtained in steps S702 and S704. The overpotential q is calculated for each of the full-cell, positive electrode and negative electrode according to the equations provided earlier, namely:

$$\eta_{cell}=V_{cell}-U_{cell} \quad \text{Equation 3:}$$

$$\eta_{pos}=V_{pos}-U_{pos} \quad \text{Equation 4:}$$

$$\eta_{neg}=V_{neg}-U_{neg} \quad \text{Equation 5:}$$

FIGS. 5A, 5B and 5C discussed above illustrate the overpotential profiles calculated from the data shown in FIGS. 3 and 4.

In step S708, overpotential fraction maps $\eta_{f,pos}$ and $\eta_{f,neg}$ for each of the positive and negative electrodes are produced, wherein the overpotential at each electrode is obtained as a fraction of the full-cell overpotential under that same circumstance. Since each of $\eta_{cell}$ $\eta_{pos}$ and $\eta_{neg}$ are known, and based on Equations 6 and 7 above, the fraction maps can be calculated for each respective value of state-of-charge across the state-of-charge window according to the following equations:

$$\eta_{f,pos} = \frac{\eta_{pos}}{\eta_{cell}} \quad \text{Equation 8}$$

$$\eta_{f,neg} = \frac{\eta_{neg}}{\eta_{cell}} \quad \text{Equation 9}$$

In other words, the overpotential fraction maps can be understood to be profiles which at any given state-of-charge value, represent the fractional amount of the total cell overpotential $\eta_{cell}$ that is attributable to the potential at the positive electrode and the negative electrode.

For any given state-of-charge value, the positive electrode overpotential fraction $\eta_{f,pos}$ is the ratio of the overpotential $\eta_{pos}$ occurring at the positive electrode to the cell overpotential $\eta_{cell}$. The negative electrode overpotential fraction $\eta_{f,neg}$ is the ratio of overpotential $\eta_{neg}$ occurring at the negative electrode to the cell overpotential $\eta_{cell}$. Expressed mathematically, the overpotential fraction maps behave as:

$$1>\eta_{f,pos}>0$$

$$1>\eta_{f,neg}>0$$

$$\eta_{f,neg}+\eta_{f,pos}\approx 1$$

Figure 8A:
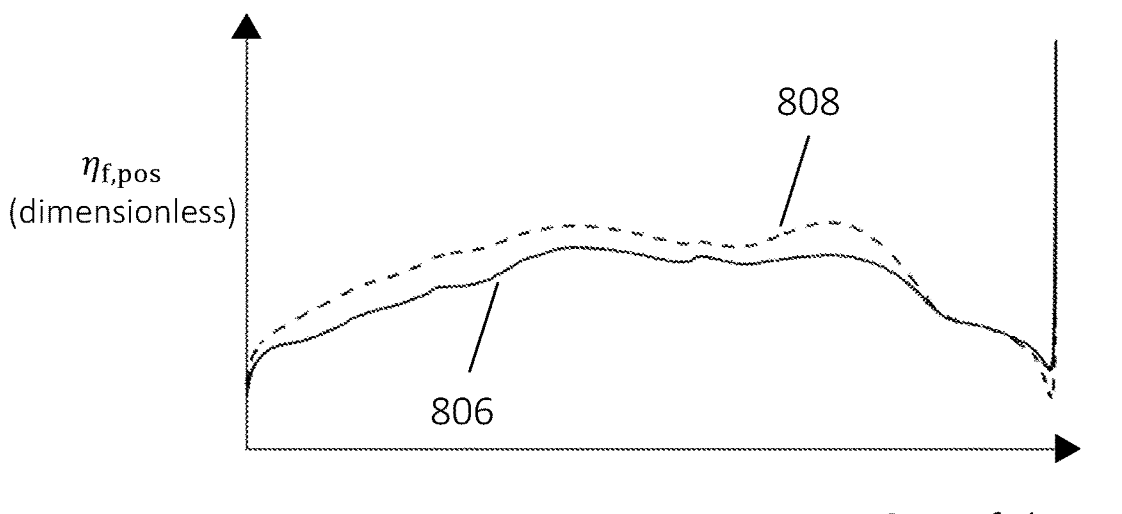
FIG. 8 illustrates a reference overpotential fraction representation produced for both a positive (FIG. 8A) and negative (FIG. 8B) electrode at two different C-rates for the reference battery.
Figure 8B:
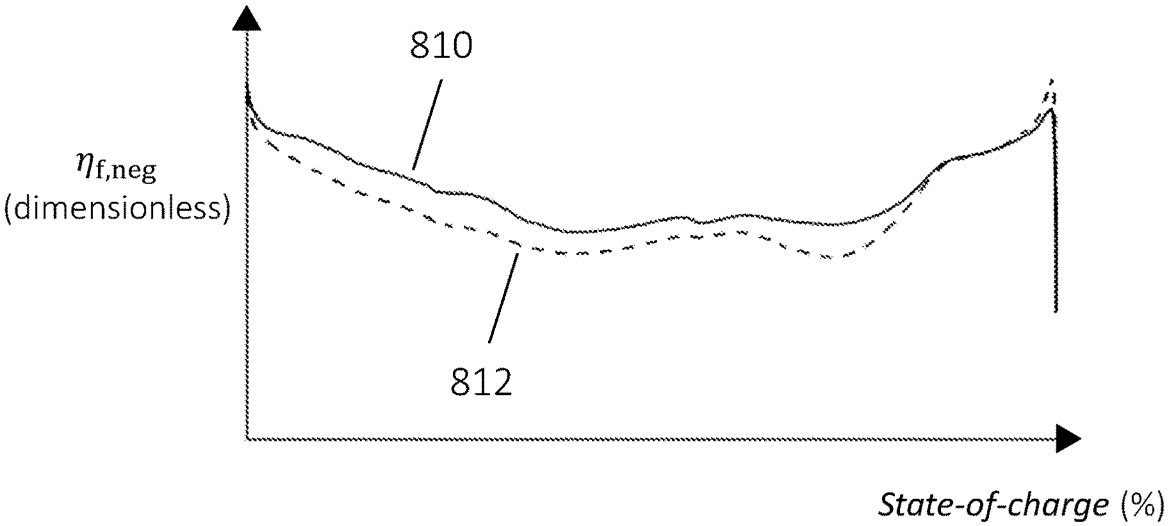

The overpotential fraction maps are illustrated in FIGS. 8A and 8B. In FIG. 8A, plot 806 is a positive electrode overpotential fraction map for a relatively low current, while plot 808 is a positive electrode overpotential fraction map for a relatively high current. In FIG. 8B, plot 810 is a negative electrode overpotential fraction map for a relatively low current, while 812 is a negative electrode overpotential fraction map for a relatively high current. Although FIGS. 8A and 8B give each map for two different exemplary charging currents, and each map is shown only for a single temperature and state-of-health, in embodiments maps be generated to include these additional dependencies.

In FIGS. 8A and 8B, typical values for $\eta_{f,pos}$ and $\eta_{f,neg}$ at 50% state-of-charge and the same relatively low applied current would be 0.47 and 0.53, respectively, and the overpotential fraction maps exemplified are based on underlying open-circuit potential and non-equilibrium potential data obtained at 25 degrees Celsius. Although, in the example shown for FIG. 8, there exists a trend for the positive electrode overpotential fraction to increase at the expense of the negative electrode's overpotential fraction as the current is increased, this behaviour may differ with different batteries and different materials.

In step S710, the overpotential fraction maps are stored in memory and are then available for use by the battery management controller 10. Owing to behaviour given earlier whereby $\eta_{f,neg}+\eta_{f,pos}\approx 1$, it is alternatively possible to store only the overpotential fraction for one electrode in memory and to calculate the overpotential fraction for the second electrode as-needed by subtracting the overpotential fraction in memory from unity. In this way, memory requirements for the invention or for the battery management controller 10 may be reduced.

It is not necessary to repeat steps S704 to S710 once the maps for a particular battery and temperature have been completed. However, doing so and having multiple overpotential fraction maps available across a range of currents (and temperatures) can improve the accuracy of electrode potential estimation in the subsequent battery management method.

In practice, when higher charge/discharge currents are applied to the reference electrode cell in step S704, the resulting polarisation can be large and can force an earlier termination of the charge/discharge process when the cell potential reaches a limiting value, such as an upper cut off of 4.2 Volts in the case of charging. This earlier cut-off may make it challenging to obtain cell and electrode potential data in the high (charging scenario) and low (discharging scenario) state-of-charge range. The quantity of unobtainable data typically increases with increasing rates (notwithstanding the ability of temperature to reduce the polarisation). A post-processing step where unobtained data values are obtained by imputation or similar process may be used to alleviate the issue.

The method for determining the overpotential fraction maps illustrated in connection with FIGS. 6 to 8 has been based on discussion of a lithium-ion battery. However, the method is not restricted to lithium-ion batteries and it can also be used with a wide range of batteries and electrochemical systems. In the case of different battery technologies, the process of FIG. 7 would need to be completed for each respective battery technology.

In addition to the reference electrode full cell such as that exemplified in FIG. 6, the overpotential fraction maps of FIG. 8 may be produced instead by using a pair of half-cells. In such a case, the first half-cell consists of the following elements: one electrode which would ordinarily be the positive electrode in a full-cell, and a counter-electrode made of a reference material such as lithium metal. The second half-cell consists of the following elements: one electrode which would ordinarily be the negative electrode in a full-cell, and a counter-electrode made of a reference material such as lithium metal.

Alternately, the overpotential faction maps may be produced by operating a battery model, e.g. via computer simulation, which may be capable of outputting the electrode potential data in a similar fashion to that available from the above-described experiments with a full-cell or pair of half-cells. Compared with the experimental approach, producing the overpotential fraction maps using a model can reduce or eliminate the need for laboratory work and provide a more computer based and potentially an even cheaper, faster method of obtaining the advantages of the invention.

General Implementation

Figure 9:
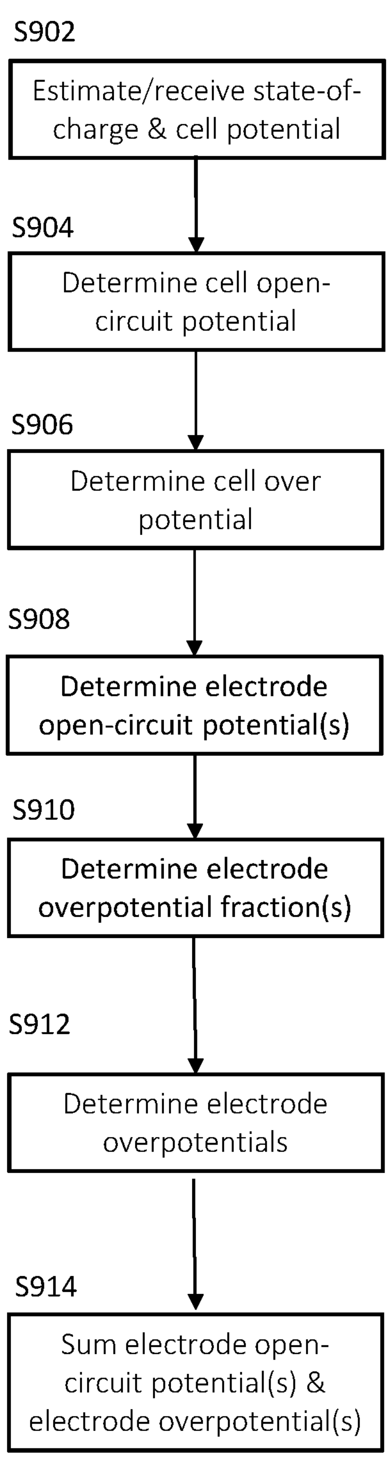
FIG. 9 illustrates a method for the estimation of individual electrode potentials using a reference overpotential fraction representation exemplified in FIG. 8.

Referring now to FIG. 9, a method of estimating the negative electrode potential required for step S208 of the battery control method of FIG. 2 will now be described.

In step 902, the battery management controller 10 receives from the charger/diagnostic unit 20 a measurement of the battery potential of the connected battery, and either receives or determines a value for the state-of-charge of the battery.

The state-of-charge of the battery is not a directly measurable quantity, and many methods exist for its estimation. A typical example is "coulomb-counting", whereby current is measured with a sensing device such as a shunt resistor, and charge throughput is recorded and used to estimate state-of-charge. Any suitable method may be used by the battery management controller 10, including provision of the state-of-charge estimate from another element of software based on the measured battery potential, or by using a look-up table stored in memory. A measured or estimated battery temperature may be an additional input here, particularly if it is required for acquiring or indexing data stored in memory, such as open-circuit potentials or overpotential fraction maps generated for specific temperatures.

In step S904, the cell open-circuit potential $U_{cell}$ of the connected battery at the state-of-charge estimated or determined in step S902 is obtained from the appropriate open-circuit potential representation available in memory for $U_{cell}$ (see FIG. 3A) by indexing with state-of-charge. The data stored for the reference battery is used as a look-up using the state-of-charge determined for the connected battery as the look-up key. This assumes that the connected battery behaves identically to the reference battery for which data is stored. In practice, this approximation has been found to be satisfactory. In embodiments, the lookup table may be replaced or implemented in part by a mathematical function representing the $U_{cell}$ profile.

In step S906, a value for the battery overpotential is calculated by subtracting the battery open-circuit potential calculated in step S904, from the battery potential measured in step S902.

In step S908, the open-circuit electrode potentials $U_{neg}$ and/or $U_{pos}$ of the connected battery at the state-of-charge estimated or determined in step S902 is obtained from the appropriate representation stored in memory for $U_{neg}$ and $U_{pos}$ (see FIGS. 3B and 3C) by indexing with the determined state-of-charge. In embodiments, the representation may be a look-up table or implemented in part by a mathematical function representing the $U_{neg}$ and $U_{pos}$ profiles.

In step S910, the overpotential fractions $\eta_{f,pos}$ and/or $\eta_{f,neg}$ of the connected battery at the determined state-of-charge and temperature is then obtained from the appropriate overpotential fraction representation available in memory (See FIGS. 8A and 8B) by indexing with state-of-charge. Again, in embodiments this may be achieved using a look-up table or implemented in part by a mathematical function representing the $\eta_{f,pos}$ and $\eta_{f,neg}$ profiles.

In step S912, and knowing the cell overpotential from step S906 and the electrode overpotential fractions $\eta_{f,pos}$ and/or $\eta_{f,neg}$ from step S910, the electrode overpotential $\eta_{pos}$ and/or $\eta_{neg}$ is now determined for one or both of the electrodes according to:

$$\eta_{pos}=\eta_{cell}\times\eta_{f,pos} \quad \text{Equation 6:}$$

$$\eta_{neg}=\eta_{cell}\times\eta_{f,neg} \quad \text{Equation 7:}$$

Finally, in step S914, and based on the electrode overpotentials $\eta_{pos}$ and $\eta_{neg}$ calculated in step S912 and the electrode open-circuit potentials $U_{neg}$ and/or $U_{pos}$ calculated n step S908, the non-equilibrium electrode potentials $V_{neg}$ and $V_{pos}$ for the negative and/or positive electrodes are now calculated, according to:

$$V_{pos}=U_{pos}+\eta_{pos} \quad \text{Equation 8:}$$

$$V_{neg}=U_{neg}+\eta_{neg} \quad \text{Equation 9:}$$

In step S914, non-absolute values of all quantities are used in calculation such that during battery charging:

$\eta_{pos}>0$ so that $V_{pos}>U_{pos}$, and $\eta_{neg}<0$ so that $V_{neg}<U_{neg}$ And during battery discharging:

$\eta_{pos}<0$ so that $V_{pos}<U_{pos}$ $\eta_{neg}>0$ so that $V_{neg}>U_{neg}$ The positive and negative electrode potentials can thus be calculated for any battery connected to the battery management controller based merely on a measurement of the battery cell potential, and an estimation of the battery state-of charge. Optionally, additional parameters may be measured or estimated to improve accuracy. Once $V_{pos}$ and $V_{neg}$ have been calculated according to FIG. 9, the method of FIG. 2 can continue at step S210 accordingly.

It will be appreciated that although the steps of FIG. 9 have been presented in a particular order, this is merely for ease of understanding, and not intended to limit the invention. Steps S908 to determine the electrode open-circuit potential for example could occur at any stage of the method, provided the electrode open-circuit potentials are ready for use in step S914.

In all cases above, another index may be used in place of state-of-charge. Equally, state-of-charge may not be the only index used, and temperature, current, or others may be additionally used. That is, lookup tables may be multi-dimensional and/or functions may contain multiple variables.

Adapting to Battery Degradation

As electrochemical systems are used through their life, they tend to evolve and suffer from degradation leading to loss of performance and a change in their behaviour. Electrochemical behavioural changes include changes to potential profiles over the state-of-charge range, charge capacity, energy capacity and power capability.

The use of cell overpotential as a major element in the determination of electrode potential estimates means that the invention inherently exhibits a degree of adaptivity to battery degradation. This is because as a battery degrades, that degradation typically manifests as a change in the battery resistance and a change in the overpotential. By taking this into account when making electrode potential estimates, the invention is differentiated from other approaches to battery control which do not exhibit this adaptivity, such as the use of pre-determined charging current profiles defined over time or a state-of-charge window.

Nevertheless, as a result of degradation, some recorded battery parameters and maps which were initially good representations of behaviour at the beginning of a battery's life may no longer be as good later on in life. To extract more consistent, or a higher average level of performance from the invention, embodiments of the battery management control may attempt to account for this degradation by making adjustments to the parameters and/or maps using dynamic updates to the open-circuit potentials.

A slow charge or discharge (for example at a rate in the range C/10 to C/50) may be performed on a degraded battery. This may serve one or both of two purposes. Firstly, this can produce an updated battery capacity value accounting for any loss of charge capacity that has occurred through degradation. This updated battery capacity value may then be used to enhance or maintain the accuracy of the state-of-charge estimates being used as indices in the invention. Secondly, the recorded cell potential $U_{cell,degraded}$ can be assumed to be a sufficiently close representation of the cell's open-circuit potential vs. state-of-charge in the cell's degraded state. It will be a variation of the new cell's open-circuit potential previously given in 302, FIG. 3.

The following error e may then be calculated across a common state-of-charge window, such that all four terms are vector-quantities:

$$e=U_{cell,degraded}-(U_{pos}-U_{neg}) \quad \text{Equation 10:}$$

Where the $U_{pos}-U_{neg}$ term provides the calculated cell's open-circuit potential $U_{cell}$ when new, in terms of the individual electrode open-circuit potentials which were available from computer memory, having been obtained initially in S902. The error can be expected to be non-zero owing to the occurrence of degradation. That is to say that graphically, the subtraction of the negative electrode open-circuit potential profile 306 from that of the positive electrode 304 will no longer produce the latest available measurement of the cell open-circuit potential, $U_{cell,degraded}$.

A non-zero error indicates that the open-circuit parameters $U_{cell}$, $U_{pos}$ and $U_{neg}$ would benefit from an update. The updated values may be obtained as follows:

The cell open-circuit potential (Le may be replaced in available memory by $U_{cell,degraded}$ measured on the slow charge or discharge, or some variation thereof, such as an average of that measured on the slow charge and discharge An optimisation may be performed with the goal of adjusting $U_{pos}$ to a new vector quantity $U_{pos,degraded}$ and of adjusting $U_{neg}$ to a new vector quantity $U_{neg,degraded}$ such that the magnitude of the error value e is reduced towards zero. In such a case, $U_{pos}$ is replaced in computer memory with $U_{pos,degraded}$, and $U_{neg}$ is replaced by $U_{neg,degraded}$.

The outcome is three new datasets, one describing a new version of profile 302 in FIG. 3A having been obtained by measurement, another describing a new version of 304 having been obtained by optimisation and another describing a new version of 306 having also been obtained by optimisation.

In general the frequency of dynamic updates can be given by: opportunistic timings, with updates occurring when the application provides a window in which the updates can be carried-out without interrupting normal usage, for example, during downtime such as an electric vehicle laying idle overnight, or during charging; a schedule of fixed time periods throughout the lifetime of the battery, for example, monthly; and/or a schedule of fixed amounts of degradation, as measured by some metric or combinations of metrics, for example, every 5% loss of battery charge capacity measured at a 1 C charge rate.

The relatively low computer memory requirements of the invention make it possible to pre-load updated parameters that are obtained in advance of the first use of a battery and which are based on its expected degradation.

FIG. 6 illustrates the construction of a reference full-cell in which the electrodes were new. It is possible to reconstruct the reference full-cell using electrodes which are degraded. To do so, the existing full-cell prior to its disassembly may for example be degraded through usage, and then disassembled to harvest the electrodes.

Acquiring open-circuit potential data (702) and non-equilibrium potentials (704) using these degraded electrodes will provide open-circuit potential data (similar to FIG. 3) that more accurately represents that of the battery when it is aged (i.e. following some degree of time or usage). Moreover, producing overpotential fraction maps (708) using this data produces maps that are also more representative of the overpotential fractions of an aged battery.

The method and extent of ageing applied to the battery prior to its disassembly for electrode harvesting can be designed in an attempt to closely mimic that which is expected in the battery on which the invention will be used.

In the case of dynamic updates or pre-prepared updates, the parameters may be stored, along with diagnostic data, to provide information on the safety, health/degradation pathway throughout life and for any further use or disposal or recycling of the cell. That is, the diagnostic information obtained may be stored and used at a later date to inform further use of the battery beyond its first life.

Finally, it is possible to combine the two approaches; dynamic updates and pre-loaded updates together.

Variations

The example implementation of the invention in FIGS. 1 and 2 is one where the invention is used to control charging current. In alternative embodiments, other similar parameters or proxies of charging current may be instead controlled, such as current density (areal or volumetric), C-rate, power (Watts), power density (areal or volumetric), E-rate (the ratio of power to battery capacity).

A further alternative exemplary application is one where the invention is used to control the duration of a charge or discharge process. In such an example the end-of-charge/discharge may be controlled by the process value(s) (electrode potential(s)) having reached, or become within a set range of, the set point(s). The set point value(s) and at which end-of-charge/discharge occurs might be chosen such that the battery is protected from excess degradation. For example, set point(s) chosen to prevent a positive electrode potential from falling "too" far, and/or negative electrode potential from rising "too" high, during a discharge process. Alternative example; set point(s) chosen to prevent positive electrode potential from rising "too" high during a charging process and/or negative electrode potential falling "too" low, and so terminating the charging process.

Further, the example of FIG. 2 presented a case where only one process value was used (negative and/or positive electrode potential). There may instead be one or more process value/set point pairs in use. For example negative electrode potential, positive electrode potential, or both, providing enhanced control and protection to the battery.

In FIG. 2, (S202) the set point can alternatively be a non-physically meaningful, arbitrarily chosen value. The decision to do this may be driven by a preference to achieve a particular higher-level behaviour (e.g. charging time, battery life, battery lifetime, for example with the knowledge that in doing so either (1) excessive degradation will occur or (2) a large degree of "headroom" remains and the full performance is possibly not exploited). Such an approach is different in the sense that the choice is not directly driven by degradation (avoidance) goals.

FIGS. 1 and 2 present an example where the invention resided within a battery management system, which may for example be applicable to an electric vehicle. In this context, an electric vehicle is intended to include any urban or road vehicle, such as electric cars, battery assisted bicycles, scooters, delivery or vehicles, as well as vehicles/delivery systems for aerospace or water based applications. In the same example, a similar but alternative implementation where the charger makes the decision of the charging current to provide to the battery, instead of the battery management system making that decision, the invention may reside within the charger. An example of such a scenario may be a cordless power tool charger wherein the charger decides what current to supply to a cordless power tool's battery pack.

Although some features of the invention make it particularly suitable for use on embedded systems, the invention need not reside on an embedded system (e.g. battery management system or charger) and may instead reside on a computer elsewhere (e.g. the "cloud") and be remotely connected to an application in a real-time, near-real-time, or non-real-time control process.

Alternative Embodiments

Instead of using the overpotential maps for the estimation of electrode potential in the manner described, the overpotential maps can alternatively: be used to estimate the overpotential at each electrode which can be summed to produce an estimate of the cell overpotential, which in turn may be used for many possible means, such as to estimate when a voltage limit will be reached, or to be used in estimating the amount of energy loss (inefficiency), or to estimate heat generation. That is, the maps enable estimation of battery efficiency and polarisation extent.

As with the adaptation of invention parameters to battery degradation, control process parameters may additionally be updated. For example, the set point may be updated to provide a consistent or a wider safety margin later in the life of the battery. Example; a consistent safety margin on charging may be beneficial for when the invention is used to control the charging current through the life of an electric vehicle whose battery will exhibit degradation.

When open-circuit data such as 302, 304, and 306, are recorded and stored in computer memory, it is not necessary that a single open-circuit potential profile is stored for each of the electrodes and cell for use in estimating electrode potentials during both charging and discharging. That is, a separate (and different) open-circuit potential profile may be stored for use during each of charge and discharge. This is particularly so for batteries which may exhibit relatively large hysteresis in open-circuit potential profiles, for example, some batteries whose graphitic negative electrodes contain silicon.

The open-circuit data such as that in 302, 304, and 306 may additionally be defined as a function of temperature and/or battery health, such that it is acquired in embodiment 702 under these different conditions (e.g. at a different temperature such as 0 degrees Celsius or 40 degrees Celsius, at a different battery health level such as when the battery retains only 90% of its original capacity) and additionally stored in computer memory. Although this increases the memory requirements, it may be advantageous, particularly if updating of the open-circuit-potential data during the battery operation is expected to be difficult.

The overpotential fraction maps of FIG. 8 are shown as functions of state-of-charge and of current (i.e. where a unique map is provided for each of two different current levels). These maps may additionally be functions of temperature, of battery health or degradation state, and other properties, in addition to being a function of state-of-charge and current. These additional dependencies are useful for enhancing the accuracy of the map values obtained under different conditions. To construct the overpotential maps over these different variables, steps S702 to S708 inclusive are repeated under the different conditions (e.g. at a different temperature such as 0 degrees Celsius or 40 degrees Celsius, at a different battery health level such as when the battery retains only 90% of its original capacity). A basic map may therefore be a two-dimensional representation consisting of overpotential fraction for an electrode versus state-of-charge. A more advanced map may be five-dimensional, consisting of overpotential fraction for an electrode versus the following further four axes: (1) state-of-charge (exemplary range 0-100%), (2) temperature (exemplary range −10 to +45 degrees Celsius), (3) current (exemplary values 0.5 C to 5 C) and finally, (4) cell state-of-health defined by the fraction of the as-new capacity remaining (exemplary range 100% to 50%).

CONCLUSION

The embodiments of the invention discussed above require a very low number of parameters in order to estimate electrode potentials. Specifically, only 1) open-circuit potential vs. state-of-charge profiles for the cell and for each electrode 2) an overpotential fraction map (overpotential fraction vs. state-of-charge) for one or each electrode. i.e. a minimum requirement of four parameters are needed. This low parameterisation requirement provides a number of benefits:

(1) Low financial and time cost (hours to days) to obtain the necessary parameters from any battery. This is in contrast to the high parameterisation requirements (weeks to months) for alternative methods of model-based electrode potential estimation, such as electrochemical “full-order” continuum battery models and even their reduced-order variants, which often require tens of parameters.

(2) Greater adaptability of parameters to battery degradation: because of the low parameter requirement (and because the parameters are relatively easily obtained) the parameters are relatively easy to update as a battery degrades during its life. This is an important advantage. The fewer parameters required initially, the larger the number or fraction of them that are likely to be able to be obtained in-situ later in the battery’s life, leading to better and/or more consistent performance from the invention. For example, all three open-circuit potential parameters (full-cell & both electrodes)—approximately three-fifths to three-quarters of the total parameter set—can be updated during the life of the battery by performing a simple slow charge. It is not possible to update in-situ experimentally many of the tens of parameters required for alternative model-based approaches to electrode potential estimation.

(c) Ease-of-parameterisation: those few parameters which are required are relatively easy to obtain. That is, the open-circuit potentials and overpotentials required can be obtained with a relatively simple reference electrode full-cell, in contrast to the far wider range of experiments, often requiring an array of more expensive specialist equipment, needed to obtain parameters for alternative approaches. Not only is this cheaper and faster initially, but it supports in-situ updating of parameters when the battery is in use/during the life of the battery.

(d) Computationally lightweight. The invention requires few computational resources (processing power and computer memory). These features provide benefits that include allowing the invention to be used on hardware including microcontrollers in embedded systems where minimisation of cost, power consumption and/or volume are desirable. For example, a microcontroller functioning as the battery management controller 10, whose total memory is measured in hundreds of kilobytes and whose processor clock speed is measured in low hundreds of MHz, an example being a Texas Instruments™ unit of the TMS570 family, is sufficient for operation of the invention. It will be appreciated that the invention is not restricted to such a hardware type or performance level, but that this serves as one possible example.

Further, the use of cell overpotential as a major element in the determination of electrode potential estimates means that the invention inherently exhibits a degree of adaptivity to battery degradation. This is because as a battery degrades, that degradation typically manifests as a change in the battery resistance and a change in the overpotential. By taking this into account when making electrode potential estimates, the invention is differentiated from other approaches to battery control which do not exhibit this adaptivity, such as the use of pre-determined charging current profiles defined over time or a state-of-charge window. In effect, this adaptivity of electrode potential estimates to degradation substantially widens the range of operational validity of the invention.

Lastly, owing to the analytical nature of the equations for estimating electrode potentials, the electrode potential solution process possesses high mathematical and numerical stability. This has the higher-level effect of ensuring a high level of reliability, dependability and overall increased safety.

The embodiments and examples discussed above are illustrative and not intended to limit the invention as defined by the following claims.

The invention claimed is:

1. A battery management method for charging or discharging a connected battery, and/or for use in a battery diagnostic method, using non-equilibrium potentials for one or more of negative and positive electrodes determined for the connected battery, the battery management method comprising the steps of:

determining for a connected battery one or more battery state parameters indicating a present state of the connected battery, the one or more battery state parameters including at least an instantaneous cell potential and a state-of-charge of the connected battery;

estimating for the connected battery, based upon the determined state-of-charge, one or more of: a connected battery open-circuit potential, and open-circuit electrode potentials for the negative and/or positive electrodes for the connected battery;

determining overpotentials for the one or more of the positive and negative electrodes of the connected battery, based on an estimated open-circuit potential for the reference battery, by referring to a reference overpotential representation that is available in memory and which maps the respective state-of-charge values for the reference battery to the corresponding fractions of the reference battery overpotential that are attributable to the negative and the positive electrodes;

determining the non-equilibrium electrode potentials for the one or more of the negative and positive electrodes of the connected battery, based on the estimated open-circuit potential of the negative and/or positive electrodes of the reference battery, and the overpotentials for the respective negative and/or positive electrode;

controlling the charging or discharging of the connected battery, or determining one or more parameters indicative of battery health depending on the determined non-equilibrium potentials for the one or more of the negative and positive electrodes.

2. The method of claim 1, wherein estimating one or more of the connected battery open-circuit potential, and the open-circuit electrode potentials for the negative and/or positive electrodes, comprises:

based upon the determined state-of-charge for the connected battery, referring to a reference open-circuit potential representation that is available in memory, which maps the respective state-of-charge values for the reference battery to the corresponding values of open-circuit potential for the reference battery, and for the negative and positive electrodes of the reference battery.

3. The method of claim 1, wherein determining the non-equilibrium electrode potentials for the one or more of the negative and positive electrode potentials comprises summing the open-circuit electrode potentials for the negative and positive electrodes with the overpotentials for the negative and positive electrodes.

4. The method of claim 1, wherein determining the connected battery overpotentials for the one or more of the negative and/or positive electrodes comprises combining a value for the connected battery overpotential with an overpotential value indicating the respective fractions of the connected battery overpotential attributable to the negative and the positive electrodes.

5. The method of claim 4, wherein determining the connected battery overpotential comprises determining the difference between the determined cell potential for the connected battery and the open-circuit potential for the reference battery.

6. The method of claim 1, wherein the connected battery state parameters further include one or more of battery temperature, charging current, and state of health.

7. The method of claim 1, wherein reference open-circuit potential representations and reference overpotential representations are determined for a plurality of different reference batteries and stored in memory.

8. The method of claim 1, comprising generating the open-circuit potential representation by monitoring the electrode potentials of the reference battery or a half cell reference battery for a range of state-of-charge values.

9. The method of claim 1, wherein the determined state-of-charge for the connected battery is used in place of the state-of-charge of the reference battery to look up the corresponding values in the open-circuit representation or the overpotential representation.

10. The system of claim 1, wherein the connected battery state parameters further include one or more of battery temperature, charging current, and state-of-health.

11. The system of claim 1, wherein reference open-circuit potential representations and reference overpotential representations are determined for a plurality of different reference batteries and stored in memory.

12. The system of claim 1, wherein the processor is configured to generate the open-circuit potential representation by monitoring the electrode potentials of the reference battery or a half cell reference battery for a range of state-of-charge values.

13. The system of claim 1, wherein the determined state-of-charge for the connected battery is used in place of the state-of-charge of the reference battery to look up the corresponding values in the open-circuit representation or the overpotential representation.

14. A computer readable medium having computer code stored thereon, which when executed by a computer causes the computer to perform the steps of method claim 1.

15. A battery management system for charging or discharging a connected battery, and/or for use in a battery diagnostic method, using non-equilibrium potentials for one or more of the negative and positive electrodes determined for the connected battery, the battery management system comprising a processor configured to perform the steps of:

determining for the connected battery one or more battery state parameters indicating; the present state of the connected battery, the one or more battery state parameters including at least an instantaneous cell potential and a state-of-charge of the connected battery;

estimating for the connected battery, based upon the determined state-of-charge, one or more of: a connected battery open-circuit potential, and open-circuit electrode potentials for the negative and/or positive electrodes for the connected battery;

determining overpotentials for the one or more of the positive and negative electrodes of the connected battery, based on an estimated open-circuit potential for a reference battery, by referring to a reference overpotential representation that is available in memory and which maps the respective state-of-charge values for the reference battery to corresponding fractions of the reference battery overpotential that are attributable to the negative and the positive electrodes;

determining the non-equilibrium electrode potentials for the one or more of the negative and positive electrodes of the connected battery, based on an estimated open-circuit potential of the negative and/or positive electrodes of the reference battery, and the overpotentials for the respective negative and/or positive electrode;

controlling the charging or discharging of the connected battery, or determining one or more parameters indicative of battery health depending on the determined non-equilibrium potentials for the one or more of the negative and positive electrodes.

16. The system of claim 15, wherein estimating one or more of the connected battery open-circuit potential, and the open-circuit electrode potentials for the negative and/or positive electrodes, comprises: based upon the determined state-of-charge for the connected battery, referring to a reference open-circuit potential representation that is available in memory, which maps the respective state-of-charge values for the reference battery to the corresponding values of open-circuit potential for the reference battery, and for the negative and positive electrodes of the reference battery.

17. The system of claim 15, wherein determining the non-equilibrium electrode potentials for the one or more of the negative and positive electrode potentials comprises summing the open-circuit electrode potentials for the negative and positive electrodes with the overpotentials for the negative and positive electrodes.

18. The system of claim 15, wherein determining the connected battery overpotentials for the one or more of the negative and/or positive electrodes comprises combining a value for the connected battery overpotential with an overpotential value indicating the respective fractions of the connected battery overpotential attributable to the negative and the positive electrodes.

19. The system of claim 18, wherein determining the connected battery overpotential comprises determining the difference between the determined cell potential for the connected battery and the open-circuit potential for the reference battery.

* * * * *